United States Patent
Au et al.

(10) Patent No.: US 7,093,047 B2
(45) Date of Patent: Aug. 15, 2006

(54) INTEGRATED CIRCUIT MEMORY DEVICES HAVING CLOCK SIGNAL ARBITRATION CIRCUITS THEREIN AND METHODS OF PERFORMING CLOCK SIGNAL ARBITRATION

(75) Inventors: Mario Au, Fremont, CA (US); Jiann-Jeng Duh, San Jose, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 437 days.

(21) Appl. No.: 10/613,246

(22) Filed: Jul. 3, 2003

(65) Prior Publication Data
US 2005/0005069 A1    Jan. 6, 2005

(51) Int. Cl.
G06F 13/14 (2006.01)
G06F 12/08 (2006.01)
G11C 7/10 (2006.01)

(52) U.S. Cl. .................... 710/243; 710/58; 711/167
(58) Field of Classification Search .................... None
See application file for complete search history.

(56) References Cited

U.S. PATENT DOCUMENTS

| | | | | |
|---|---|---|---|---|
| 4,888,741 A | 12/1989 | Malinowski | ........... | 365/230.05 |
| 5,442,747 A | 8/1995 | Chan et al. | ................. | 395/164 |
| 6,161,160 A * | 12/2000 | Niu et al. | .................... | 710/310 |
| 6,249,847 B1 * | 6/2001 | Chin et al. | ................... | 711/151 |
| 6,259,648 B1 | 7/2001 | Kragick | ................. | 365/230.05 |
| 6,366,529 B1 | 4/2002 | Williams et al. | ............ | 365/239 |
| 6,557,053 B1 | 4/2003 | Bass et al. | .................... | 710/29 |
| 6,920,540 B1 * | 7/2005 | Hampel et al. | ............. | 711/167 |

* cited by examiner

Primary Examiner—Gary Portka
(74) Attorney, Agent, or Firm—Myers Bigel Sibley & Sajovec PA

(57) ABSTRACT

A clock signal arbitration method includes arbitrating between first and second request signals generated in respective first and second clock domains that are asynchronously timed relative to each other, to obtain first arbitration results. These first arbitration results identify a relative queue priority between the first and second request signals. Additional steps are performed to transfer the first arbitration results into a third clock domain that is asynchronously timed relative to the first and second clock domains. The transfer operation may include arbitrating the first arbitration results in a third clock domain to obtain second arbitration results that confirm or correct the first arbitration results.

22 Claims, 26 Drawing Sheets

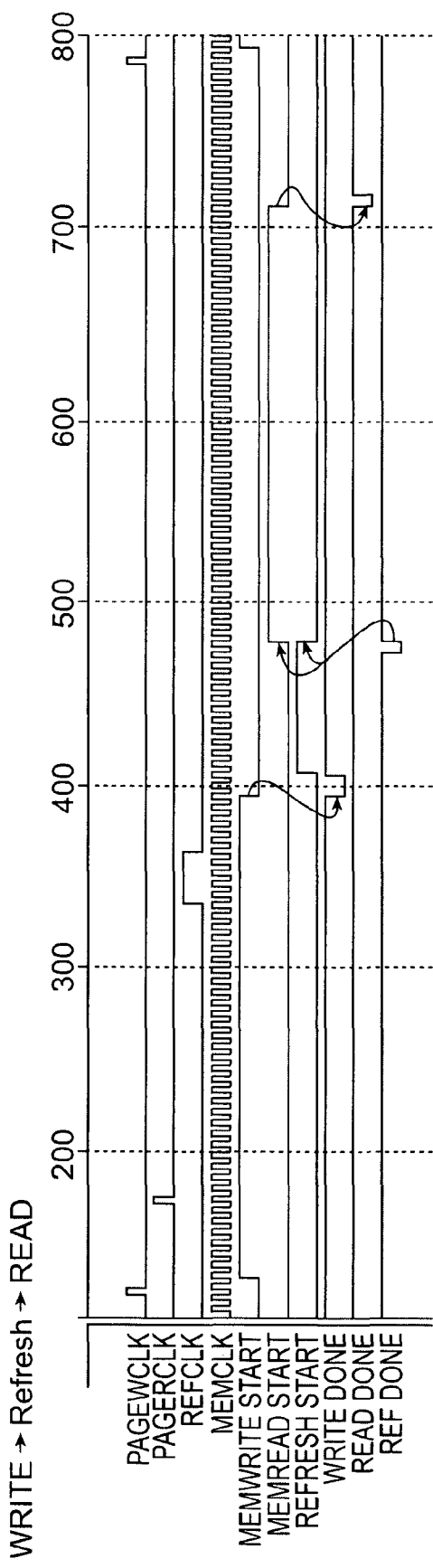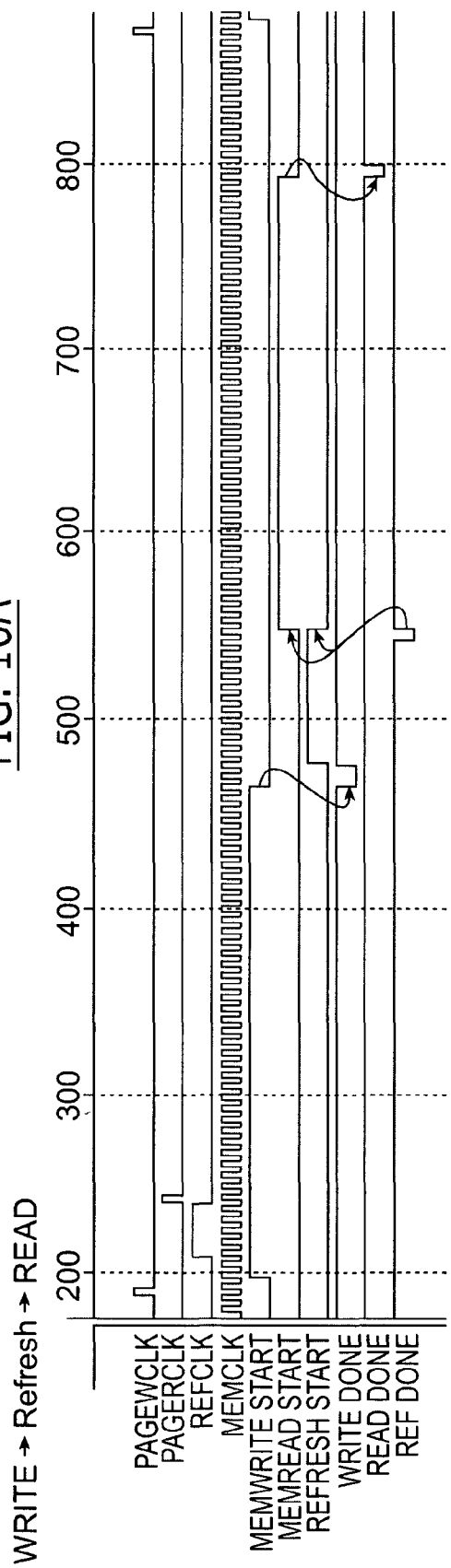

INTEGRATED CIRCUIT MEMORY DEVICES HAVING CLOCK SIGNAL ARBITRATION CIRCUITS THEREIN AND METHODS OF PERFORMING CLOCK SIGNAL ARBITRATION

FIELD OF THE INVENTION

The present invention relates to integrated circuit memory devices and methods of operating same, and more particularly to buffer memory devices and methods of operating buffer memory devices.

BACKGROUND OF THE INVENTION

Semiconductor memory devices can typically be classified on the basis of memory functionality, data access patterns and the nature of the data storage mechanism. For example, distinctions are typically made between read-only memory (ROM) devices and read-write memory (RWM) devices. The RWM devices typically have the advantage of offering both read and write functionality with comparable data access times. Typically, in RWM devices, data is stored either in flip-flops for "static" memory devices or as preset levels of charge on a capacitor in "dynamic" memory devices. As will be understood by those skilled in the art, static memory devices retain their data as long as a supply of power is maintained, however, dynamic memory devices require periodic data refreshing to compensate for potential charge leakage. Because RWM devices use active circuitry to store data, they belong to a class of memory devices known as "volatile" memory devices because data stored therein will be lost upon termination of the power supply. ROM devices, on the other hand, may encode data into circuit topology (e.g., by blowing fuses, removing diodes, etc.). Since this latter type of data storage may be hardwired, the data cannot be modified, but can only be read. ROM devices typically belong to a class of memory devices known as "nonvolatile" memory devices because data stored therein will typically not be lost upon termination of the power supply. Other types of memory devices that have been more recently developed are typically referred to as nonvolatile read-write (NVRWM) memory devices. These types of memory devices include EPROM (erasable programmable read-only memory), E$^2$PROM (electrically erasable programmable read-only memory), and flash memories, for example.

An additional memory classification is typically based on the order in which data can be accessed. Here, most memory devices belong to the random-access class, which means that memory locations can be read from or written to in random order, typically by supplying a read or write address. Notwithstanding the fact that most memory devices provide random-access, typically only random-access RWM memories use the acronym RAM. Alternatively, memory devices may restrict the order of data access to achieve shorter data access times, reduce layout area and/or provide specialized functionality. Examples of such specialized memory devices include buffer memory devices such as first-in first-out (FIFO) memory devices, last-in first-out (LIFO or "stack") memory devices, shift registers and content addressable memory (CAM) devices.

A final classification of semiconductor memories is based on the number of input and output ports associated with the memory cells therein. For example, although most memory devices have unit cells therein that provide only a single port which is shared to provide an input and output path for the transfer of data, memory devices with higher bandwidth requirements often have cells therein with multiple input and output ports. However, the addition of ports to individual memory cells typically increases the complexity and layout area requirements for these higher bandwidth memory devices.

Single-port memory devices are typically made using static RAM cells if fast data access times are requiring, and dynamic RAM cells if low cost is a primary requirement. Many FIFO memory devices use dual-port RAM-based designs with self-incrementing internal read and write pointers to achieve fast fall-through capability. As will be understood by those skilled in the art, fall-through capability is typically measured as the time elapsing between the end of a write cycle into a previously empty FIFO and the time an operation to read that data may begin. Exemplary FIFO memory devices are more fully described and illustrated at section 2.2.7 of a textbook by A. K. Sharma entitled "Semiconductor Memories: Technology, Testing and Reliability", IEEE Press (1997).

In particular, dual-port SRAM-based FIFOs typically utilize separate read and write pointers to advantageously allow read and write operations to occur independently of each other and achieve fast fall-through capability since data written into a dual-port SRAM FIFO can be immediately accessed for reading. Since these read and write operations may occur independently, independent read and write clocks having different frequencies may be provided to enable the FIFO to act as a buffer between peripheral devices operating at different rates. Unfortunately, a major disadvantage of typical dual-port SRAM-based FIFOs is the relatively large unit cell size for each dual-port SRAM cell therein. Thus, for a given semiconductor chip size, dual-port buffer memory devices typically provide less memory capacity relative to single-port buffer memory devices. For example, using a standard DRAM cell as a reference unit cell consuming one (1) unit of area, a single-port SRAM unit cell typically may consume four (4) units of area and a dual-port SRAM unit cell typically may consume sixteen (16) units of area. Moreover, the relatively large unit cells of a dual-port SRAM FIFO may limit the degree to which the number of write operations can exceed the number of read operations, that is, limit the capacity of the FIFO.

To address these limitations of dual-port buffer memory devices, single-port buffer memory devices have been developed to, among other things, achieve higher data capacities for a given semiconductor chip size. For example, U.S. Pat. No. 5,546,347 to Ko et al. entitled "Interleaving Architecture And Method For A High Density FIFO", assigned to the present assignee, discloses a memory device which has high capacity and uses relatively small single-port memory cells. However, the use of only single port memory cells typically precludes simultaneous read and write access to data in the same memory cell, which means that single-port buffer memory devices typically have slower fall-through time than comparable dual-port memory devices. Moreover, single-port buffer memory devices may use complicated arbitration hardware to control sequencing and queuing of reading and writing operations.

U.S. Pat. No. 5,371,708 to Kobayashi also discloses a FIFO memory device containing a single-port memory array, a read data register for holding read data from the memory array and a write data register for holding write data to the memory array. A bypass switch is provided for transferring data from the write data register to the read data register so that the memory array can be bypassed during testing of the FIFO to detect the presence of defects therein.

However, like the above-described single-port buffer memory devices, simultaneous read and write access to data is not feasible.

Commonly assigned U.S. Pat. Nos. 5,978,307, 5,982,700 and 5,999,478 disclose memory buffers having fast fall-through capability. These memory buffers contain a tri-port memory array of moderate capacity having nonlinear columns of tri-port cells therein which collectively form four separate registers, and a substantially larger capacity supplemental memory array (e.g., DRAM array) having cells therein with reduced unit cell size. The tri-port memory array has a read port, a write port and a bidirectional input/output port. The tri-port memory array communicates internally with the supplemental memory array via the bidirectional input/output port and communicates with external devices (e.g., peripheral devices) via the read and write data ports. Efficient steering circuitry is also provided by a bidirectional crosspoint switch that electrically couples terminals (lines IO and IOB) of the bidirectional input/output port in parallel to bit lines (BL and BLB) in the supplemental memory array during a write-to-memory time interval and vice versa during a read-from-memory time interval.

U.S. Pat. No. 6,557,053 to Bass et al. discloses a queue manager for a FIFO buffer, which includes separate DRAM storage that maintains a FIFO queue. Write operations and read operations to and from the DRAM storage may be performed in burst mode.

Notwithstanding the above described buffer memory devices, there still exists a need to develop high speed buffer memory devices having expanded functionality, increased data capacity and higher speed performance.

SUMMARY OF THE INVENTION

Integrated circuit memory devices according to some embodiments of the present invention include a quad-port cache memory device and a higher capacity supplemental memory device. These memory devices operate collectively as high speed buffer memory devices having fast fall through capability and extended data capacity. These devices do not require complex arbitration circuitry to oversee reading and writing operations. In come cases, the supplemental memory device may be an embedded on-chip memory device or a separate off-chip memory device.

The quad-port cache memory device may comprise a data input register having an input electrically coupled to a first port of the cache memory device and an output electrically coupled to a second port of the cache memory device. A multiplexer is also provided. This multiplexer is responsive to at least one select signal and has a first input electrically coupled to the output of the data input register and a second input electrically coupled to a third port of the cache memory device. The quad-port cache memory device also preferably includes an output register having an input electrically coupled to an output of the multiplexer and an output electrically coupled to a fourth port of the cache memory device. Retransmit capability may also be provided by including a retransmit register within the quad-port cache. This retransmit register has an input electrically coupled to the first port and an output electrically coupled to a third input of the multiplexer. The at least one select signal may include three (3) select signals. These select signals may be a retransmit path select signal, a memory path select signal and a direct path select signal. The data input register, the output register and the retransmit register may be responsive to write address, a read address and a retransmit address, respectively.

Other embodiments of the present invention include buffer memory devices that support bus matching and variable data bus widths. These memory devices include a memory array having a page of multi-port memory cells therein that spans at least X columns and Y rows. The page of memory cells is configured to support writing and reading of first data vectors to and from the X columns and writing and reading of second data vectors to and from the Y rows, where X and Y are unequal integers. In some of these embodiments, the first data vectors are Y-bit words and the second data vectors are X-bit words (e.g., Y=72 and X=36 in a page having 2592 (=72×36) multi-port memory cells) and the multi-port memory cells are quad-port memory cells. In other ones of these embodiments, the memory devices are first-in first-out (FIFO) memory devices.

Such FIFO memory devices may include a first cache memory device having a first page of quad-port memory cells therein. This first page is configured to support writing and reading of FIFO vectors to and from columns in the first page and writing and reading of memory vectors to and from rows in the first page, with each of the memory vectors including one bit of data from each of the FIFO vectors and vice versa. These memory vectors may have widths that are compatible with the bus widths associated with off-chip supplemental memory devices (e.g., DRAM, SRAM, etc.) that operate with the first cache memory device to provide a large capacity FIFO memory device. The FIFO memory device may also include a second cache memory device that is configured to operate in tandem with the first quad-port cache memory device so that FIFO write (and read) operations periodically switch back-and-forth between the first cache memory device and the second cache memory device. Error detection and correction circuitry may also be provided within the FIFO memory device. In particular, a check bit generation circuit may be provided that is configured to receive outgoing memory vectors from the first cache memory device. An error detection and correction circuit may be provided that is configured to provide incoming memory vectors to the first cache memory device. These incoming memory vectors are checked for errors (e.g., soft errors) and, if necessary, corrected.

Methods of operating memory devices according to these embodiments of the present invention may include writing a page of FIFO data by transferring a plurality of first data vectors from a first bus to a respective plurality of columns of multi-port memory cells within a memory array. When the memory array has been filled, the page of FIFO data is transferred to a higher capacity supplemental memory. This transfer step may be performed by reading a plurality of second data vectors from respective rows of the memory array to a second bus. The first and second data buses may be configured to have different widths. The width of the second data bus may also be varied depending upon application. In some applications, the width of the first data bus may match the number of rows withing the memory array and the width of the second data bus may match the number of columns within the memory array. Thus, each of the plurality of second data vectors may include a data bit from each of the plurality of first data vectors and vice versa.

Still further embodiments of the invention may include operating a first-in first-out (FIFO) memory device by writing a page of data into the FIFO memory device. This writing step may be performed by transferring a first plurality of FIFO data vectors into a respective plurality of columns of multi-port memory cells within a first cache memory array. Each of these FIFO data vectors may comprise one or more words that are received by the FIFO memory device during a respective write clock interval. Because the first cache memory array may have a relatively small capacity, a copying step is preferably performed. This copying step includes copying a page of data from the first cache memory array into an embedded or external RAM array by transferring a plurality of memory data vectors from respective rows of the first cache memory array to the RAM array. These memory data vectors may be narrower than the FIFO data vectors, to accord with the various bus constraints associated with the external RAM array. In particular, the memory data vectors may be configured so that each of the plurality of memory data vectors within a copied page includes a respective data bit from each of the plurality of FIFO data vectors. Thus, the embedded or external RAM array may store a plurality of words that comprise bits of interleaved data from multiple distinct words that are received by the FIFO during consecutive write clock intervals.

These operating methods may also include transferring the page of data back from the RAM array into a second cache memory array within the FIFO memory device. Then, in response to FIFO read operations, the page of data may be read from the second cache memory array by sequentially transferring a second plurality of FIFO data vectors from respective columns of multi-port memory cells within the second cache memory array to an output data bus. Here, the step of transferring the page of data from the RAM array into the second cache memory array may include writing a plurality of memory data vectors into rows of the second cache memory array.

In still further embodiments of the present invention, the error detection and correction operations may be performed so that any error detection and/or correction latency is hidden from the FIFO read operations. In these embodiments, first and second memory devices may be provided that are electrically coupled together by a first data path and a second data path. This first data path is configured to transfer write data from the first memory device to the second memory device when the first memory device is undergoing write operations. The transferred write data may be supplemented with check bit data provided by a check bit generator within the first data path. In contrast, the second data path is configured to transfer read data from the second memory device to the first memory device when the first memory device is undergoing read operations. An error detection and correction (EDC) circuit is provided within the second data path. The EDC circuit is configured to check and correct "next-to-read" data in the second data path using operations that hide error correcting latency from the read operations.

Further according to these embodiments, a FIFO memory device having EDC circuits therein may be provided. This FIFO memory device may include a multi-port cache memory device within a FIFO controller and a separate high capacity supplemental memory, which may be off-chip relative to the FIFO controller. The multi-port cache memory device has a write port that is configured to receive write data during FIFO write operations and a read port that is configured to supply read data during FIFO read operations. The supplemental memory device is configured to retain next-to-read FIFO data that was previously written into the multi-port cache memory device during the FIFO write operations. A data transfer control circuit may also be provided. This data transfer control circuit is configured to provide the multi-port cache memory device with a copy of the next-to-read FIFO data that is error checked and corrected during memory-to-cache data transfer operations, which advantageously hide error correcting latency from the FIFO read operations. Thus, the FIFO read operations may be performed without incurring a latency penalty associated with checking and correcting one or more errors within the FIFO data that is being transferred from the supplemental memory device to the FIFO controller. According to further aspects of this embodiment, the multi-port cache memory device may include at least first and second quad-port memory devices, and the data transfer control circuit may include a first error detection and correction circuit that is coupled to the first quad-port memory device and a second error detection and correction circuit that is coupled to the second quad-port memory device. The data transfer control circuit may further include a first check bit generation circuit that is coupled to the first quad-port memory device and a second check bit generation circuit that is coupled to the second quad-port memory device.

Methods of operating FIFO memory devices may also include reading a current page of data from one of a plurality of multi-port memory devices within a cache memory device, while simultaneously arbitrating to determine whether or not the cache memory device retains all next-to-read data relative to the current page of data. Then, in response to determining that the cache memory device does not retain all next-to-read data relative to the current page of data, a step is performed to transfer a next-to-read page of data, which has been error-checked and error-corrected, from a non-cache memory device into the cache memory device. Additional steps may also be performed. For example, following the transferring step, a step may be performed to read an error-checked page of data from another one of the plurality of multi-port memory devices while simultaneously arbitrating to determine whether or not the cache memory device retains all next-to-read data relative to the error-checked page of data. Then, in response to determining that the cache memory device retains all next-to-read data relative to the error-checked page of data, a step is performed to read data that has not been error-checked from the cache memory device. This data, which has not been error-checked, represents recently written data that has not undergone a transfer cycle between the cache memory device and the non-cache memory device. Such a transfer cycle may include a cache-to-memory transfer of first data that is followed by a memory-to-cache return of the first data to the cache memory device.

In the event the high-capacity supplemental memory array is a DRAM memory array, then 3-way signal arbitration operations may need to be performed within the FIFO controller. These signal arbitration operations may be performed to control the timing of memory refresh, memory write and memory read operations within the DRAM memory array. In some further embodiments of the present invention, these signal arbitration operations may include arbitrating between first and second request signals (e.g., read and write request signals) generated in respective first and second clock domains that are asynchronously timed relative to each other, to obtain first arbitration results that identify a relative queue priority between the first and second request signals. The first arbitration results are then transferred into a third clock domain that is asynchronously timed relative to the first and second clock domains. This transfer step may include arbitrating the first arbitration results in a third clock domain to obtain second arbitration results that confirm or correct the first arbitration results. A further step may also be performed to arbitrate the second arbitration results in the third clock domain, to obtain third arbitration results that confirm or correct the second arbitration results.

The signal arbitration operations may also include arbitrating between first and second request signals generated in respective first and second clock domains that are asynchronously timed relative to each other, to obtain intermediate arbitration results that identify a relative queue priority between the first and second request signals. Then, an operation may be performed to arbitrate between a third request signal (e.g., refresh request signal) and the intermediate arbitration results, in a third clock domain that is asynchronously timed relative to the first and second clock domains, to obtain final arbitration results that identify a relative queue priority between the first, second and third request signals.

If the third request signal has a higher request priority relative to the first and second request signals, and the first, second and third request signals are received in a first-then-second-then-third timing sequence, then the step of arbitrating between the first and second request signals may be followed by the step of performing operations associated with the first, second and third requests one-at-a-time in a first-then-third-then-second operation sequence. However, if the first, second and third request signals are received in a second-then-first-then-third timing sequence, the step of arbitrating between the first and second request signals may be followed by the step of performing operations associated with the first, second and third requests one-at-a-time in a second-then-third-then-first operation sequence.

According to additional embodiments of the present invention, a signal arbitration method includes arbitrating between first and second request signals generated in respective first and second clock domains that are asynchronously timed relative to each other, to obtain first arbitration results that identify the first request signal as having a higher queue priority relative to the second request signal. The first arbitration results are then transferred into a third clock domain that is asynchronously timed relative to the first and second clock domains. A first start command corresponding to the first request signal is then issued in the third clock domain, while the second request signal is maintained as a queued second request. An operation is then performed to arbitrate between a third request signal and the queued second request to obtain second arbitration results that identify a relative queue priority between the second queued request and the third request signal. In some cases, notwithstanding the earlier receipt of the second request relative to the third request, the second arbitration results may identify the third request signal as having a higher queue priority relative to the second queued request whenever the step of arbitrating between a third request signal and the queued second request occurs prior to completion of operations responsive to the first start command.

A signal arbitration device may also be provided in accordance with embodiments of the present invention. This signal arbitration device includes a multi-stage arbitration control circuit that is configured to arbitrate between at least first and second request signals generated in respective first and second clock domains that are asynchronously timed relative to each other. This multi-stage arbitration control circuit may also transfer arbitration results that identify a relative queue priority between the first and second request signals into a third clock domain that is asynchronously timed relative to the first and second clock domains. In particular, the multi-stage arbitration control circuit may include a first arbitration stage and a second arbitration stage. The first arbitration stage may be configured to arbitrate a request priority between the at least first and second request signals and further configured to generate first arbitration results that identify a relative queue priority between the at least first and second request signals. The second arbitration stage may be configured to buffer and rearbitrate a request priority associated with the first arbitration results. In particular, the second arbitration stage, which may be responsive to a clock signal that operates in the third clock domain, may be configured to generate second arbitration results that confirm or correct the first arbitration results. A third arbitration stage may also be provided. The third arbitration stage is configured to buffer and rearbitrate a request priority associated with the second arbitration results.

A signal arbitration device according to yet another embodiment of the present invention includes a multi-stage arbitration control circuit that is configured to arbitrate between read and write request signals generated in respective first and second clock domains that are asynchronously timed relative to each other and is further configured to transfer arbitration results that identify a relative queue priority between the read and write request signals into a third clock domain that is synchronously timed relative to the first and second clock domains. Also provided is a refresh command buffer and arbitration circuit that is responsive to a refresh start command and read and write start signals generated by the multi-stage arbitration control circuit. A clock control circuit is also provided. This clock control circuit is responsive to read, write and refresh start signals generated by the multi-stage arbitration control circuit and the refresh command buffer and arbitration circuit. Moreover, the multi-stage arbitration control circuit is responsive to a clock signal generated by the clock control circuit. In particular, the multi-stage arbitration control circuit includes a third stage that is synchronized with the clock signal generated by the clock control circuit.

BRIEF DESCRIPTION OF THE DRAWINGS

FIGS. 16A–16H are timing diagrams that illustrate the timing of request signal arbitration operations according to embodiments of the present invention.

DESCRIPTION OF PREFERRED EMBODIMENTS

Figure 1:
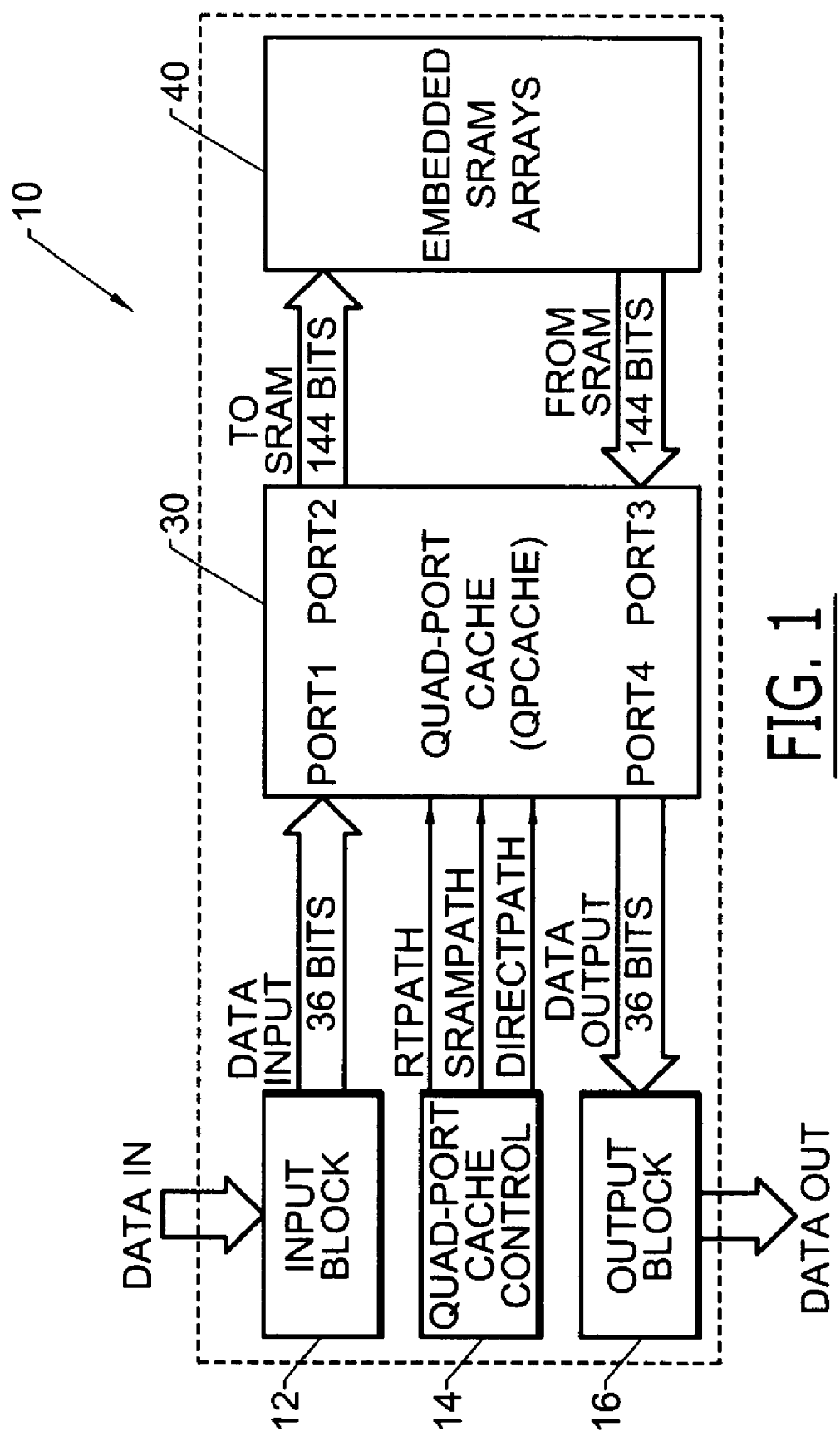
FIG. 1 is a block diagram of a buffer memory device according to embodiments of the present invention.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Referring now to FIG. 1, a preferred buffer memory device 10 according to a first embodiment of the present invention comprises a multi-port cache and an embedded memory array 40. The illustrated multi-port cache comprises a quad-port cache 30 (QPCACHE) having a first port that receives data (e.g., write data) from an input block 12 and a fourth port that transfers data (e.g., read data) to an output block 16. The second and third ports of the quad-port cache 30 are coupled to write and read ports of an embedded memory array 40 (e.g., SRAM array), respectively. As illustrated, the quad-port cache 30 is responsive to a plurality of control signals that are generated by a quad-port cache control circuit 14. These control signals, which are provided to the select inputs of a data multiplexer within the quad-port cache 30, include a retransmit path signal (RTPATH), an embedded memory path signal (SRAMPATH) and a direct path signal (DIRECTPATH).

The buffer memory device 10 of FIG. 1 may be operated as an extended capacity first-in first-out (FIFO) memory device. In particular, the quad-port cache 30 may comprise a high-speed memory device having fast fall-through capability and moderate capacity, and the embedded memory array 40 may comprise a relatively slower but more highly integrated "supplemental" memory device having a much greater storage capacity. As described more fully hereinbelow, input data can be provided to the input block 12 and then passed to the first port of the quad-port cache 30 as a sequence of N-bit words. A plurality of these N-bit words may then be passed in parallel from the second port of the quad-port cache 30 to the embedded memory array 40 as respective pages of write data. During a read operation, a selected page of memory may also be passed from the embedded memory array 40 to the third port of the quad-port cache 30. Portions of the selected page of memory may then be passed from the fourth port of the quad-port cache 30 to the output block 16 as N-bit words. Fast fall-through performance may also be achieved because data written into the quad-port cache 30 is immediately available for reading when the read and write pointers are tracking each other.

Figure 2:
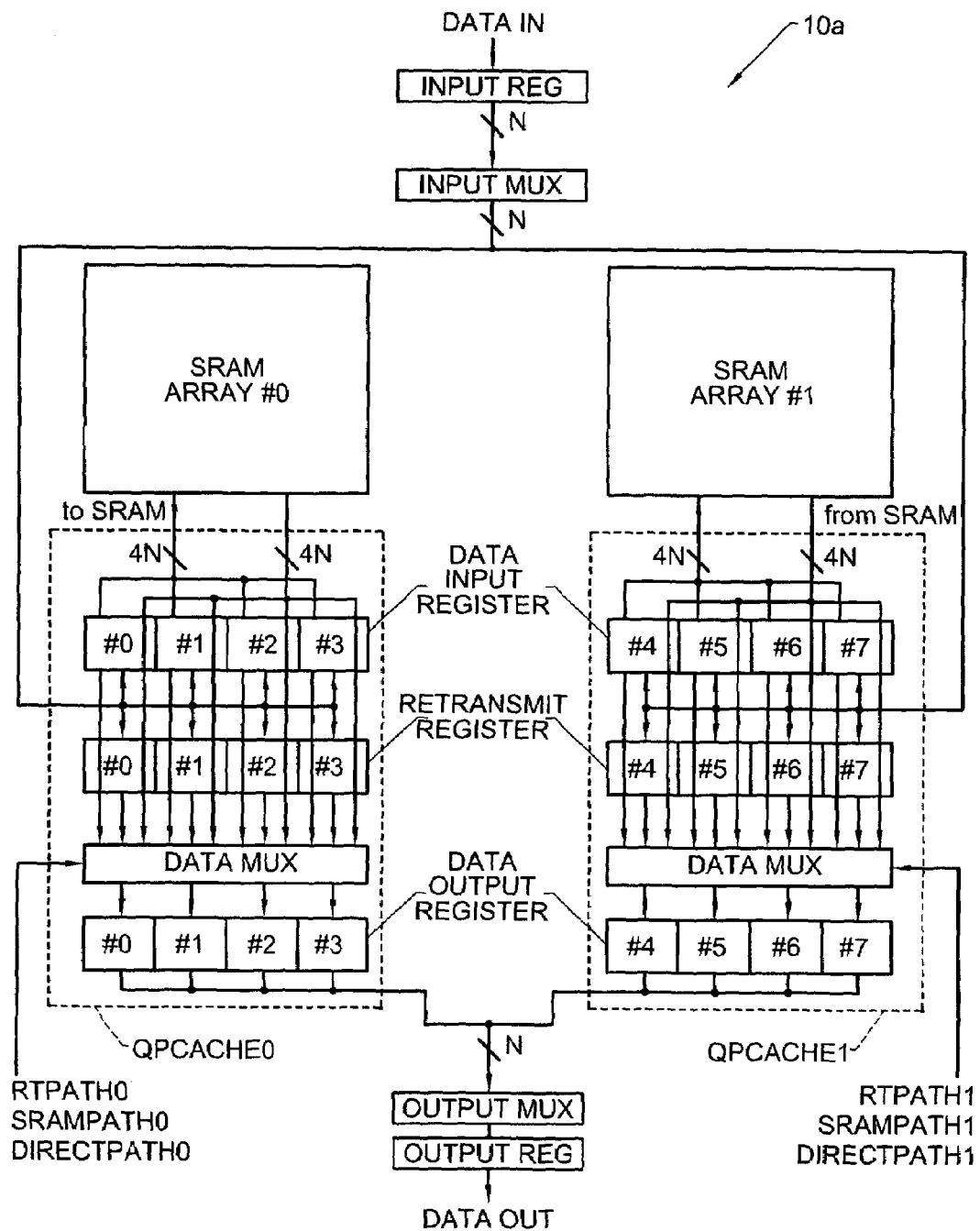
FIG. 2 is a detailed block diagram of a multi-bank buffer memory device according to other embodiments of the present invention.
Figure 3:
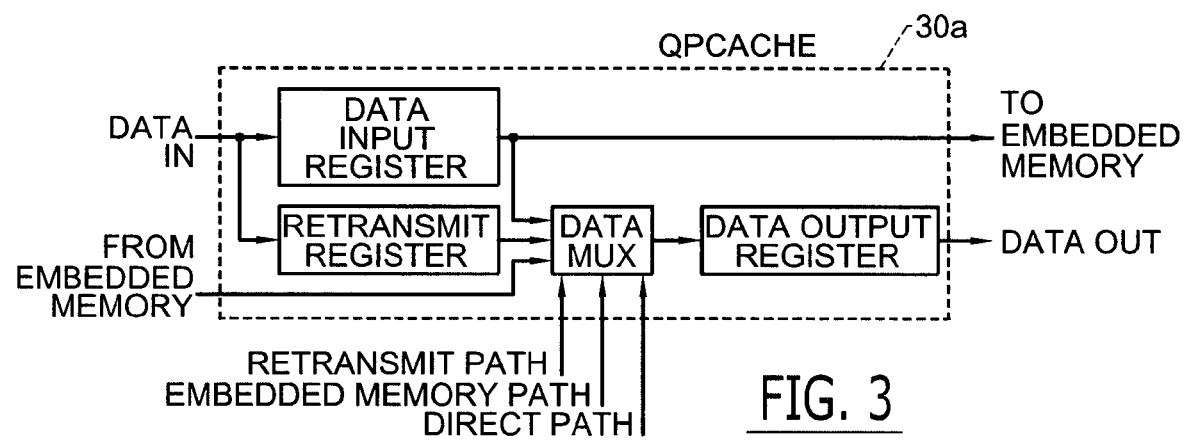
FIG. 3 is a block diagram of a cache bit cell according to embodiments of the present invention.
Figure 4:
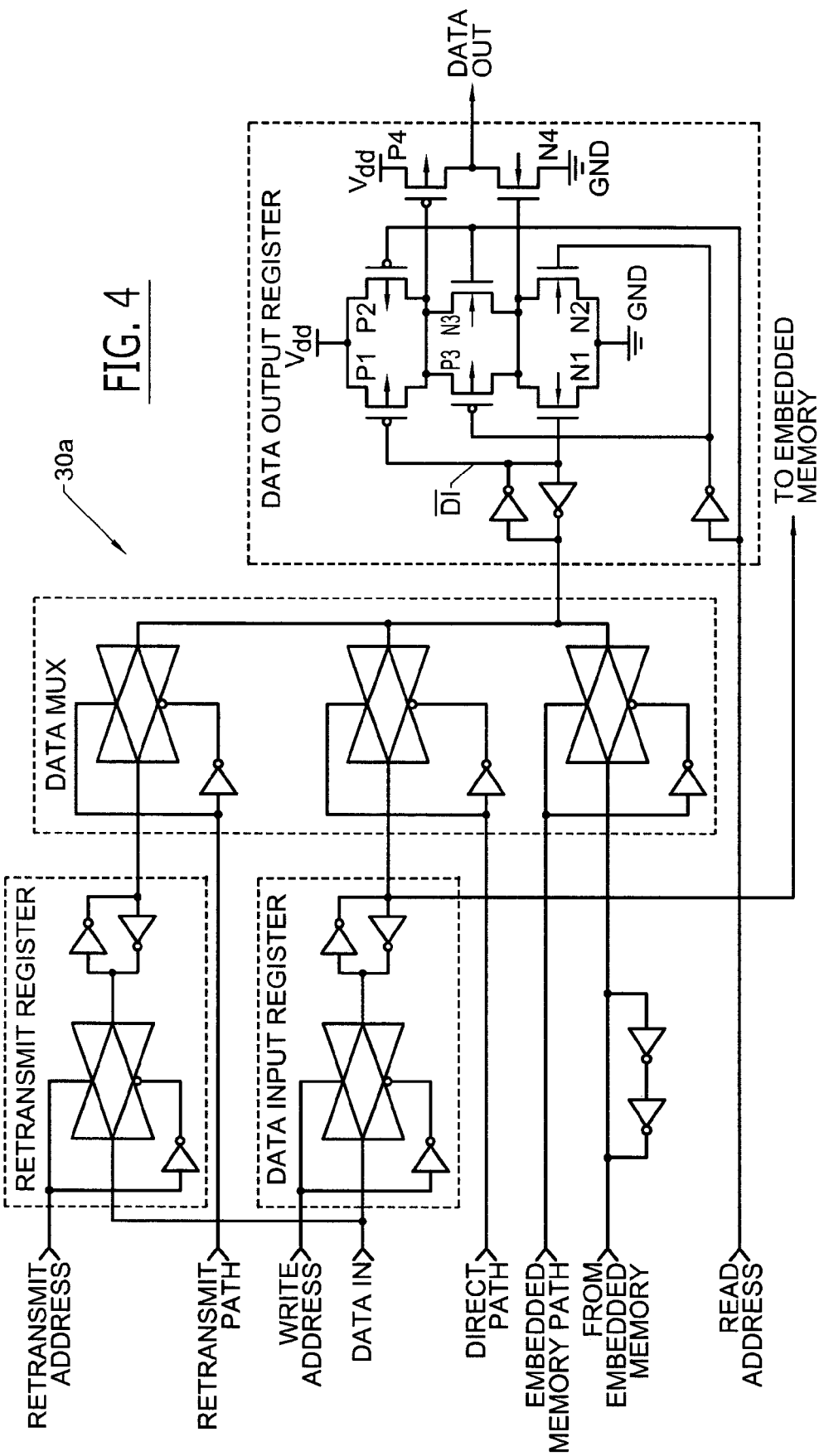
FIG. 4 is a detailed electrical schematic of the cache bit cell of FIG. 3.

As illustrated by FIGS. 2–4, the quad-port cache 30 and the embedded memory 40 of FIG. 1 may be used within a multi-bank buffer memory device 10a. In particular, FIG. 3 illustrates a block diagram of a preferred quad-port cache bit cell 30a used in the multi-bank buffer memory device 10a of FIG. 2. FIG. 4 is a detailed electrical schematic of the cache bit cell 30a of FIG. 3. The bit cell 30a of FIG. 3 comprises a multiplexer (DATA MUX) having a plurality of select inputs that are individually selected in response to a plurality of control signals. These control signals include a retransmit path signal (RETRANSMIT PATH), an embedded memory path signal (EMBEDDED MEMORY PATH) and a direct path signal (DIRECT PATH). A plurality of registers are also provided, including a data input register, a retransmit register and a data output register. The data input register receives and latches input data, upon application of an appropriate write address. The retransmit register also receives and latches initial input data, upon application of an appropriate retransmit address. The retransmit address may be applied upon commencement of write operations that follow a reset or power-up operation, for example. Accordingly, the data written to the retransmit register may be available for immediate retransmission of data stored during previous write operations. The use of a retransmit register obviates the need to perform time consuming operations to fetch initial data from the embedded memory array 40 when a retransmit request is received by the buffer memory device 10a. This retransmit request, which is frequently referred to as a "retransmit from zero" request, may be generated by a peripheral device that is communicating with the buffer memory device 10a. A data output register is also provided within the quad-port cache bit cell 30a. Depending on the state of the control signals, the data output register can be provided with (i) read data from the embedded memory, (ii) retransmit data from the retransmit register or (iii) write data stored within the data input register.

As illustrated by the detailed electrical schematic of FIG. 4, the signal lines on which the control signals are received are connected to respective transmission gates within the multiplexer (DATA MUX). The data output register has an input electrically connected to an output of the multiplexer. The data output register is also responsive to a read address.

A pair of inverters connected in antiparallel at the data input of the output register operate to generate a latched complementary data input signal/DI which is provided to a gate of PMOS pull-up transistor P1 and NMOS pull-down transistor N1. The read address is also provided to a gate of PMOS pull-up transistor P2 and a gate of intermediate NMOS transistor N3. The data output register also generates a complementary read address that is provided to a gate of intermediate PMOS transistor P3 and NMOS pull-down transistor N2, as illustrated. A tri-state output buffer stage comprising PMOS pull-up transistor P4 and NMOS pull-down transistor N4 is also provided. The gate of PMOS pull-up transistor P4 is electrically connected to the drains of PMOS pull-up transistors P1 and P2, the drain of intermediate NMOS transistor N3 and the source of the intermediate PMOS transistor P3. The gate of NMOS pull-down transistor N4 is electrically connected to the drains of NMOS pull-down transistors N1 and N2, the drain of intermediate PMOS transistor P3 and the source of intermediate NMOS transistor N3. Based on this configuration of the data output register, the generation of a logic 0 signal at the output of the multiplexer and a logic 1 read address will result in the generation of a logic 1 signal at the output of the data output register (DATA OUT). In particular, the logic 0 signal and logic 1 address will turn on: NMOS pull-down transistor N1, intermediate NMOS transistor N3, intermediate PMOS transistor P3 and PMOS pull-up transistor P4 simultaneously. In contrast, the generation of a logic 1 signal at the output of the multiplexer and a logic 1 read address will result in the generation of a logic 0 signal at the output of the data output register. Finally, the receipt of a logic 0 read address will cause the output of the data output register to enter a high impedance state, regardless of the value of the complementary data input signal/D1.

Referring again to the multi-bank memory device 10a of FIG. 2, input data is initially stored in an input register (INPUT REG) and routed to first and second quad-port caches QPCACHE0 and QPCACHE1 by an input multiplexer (INPUT MUX). The input register may be electrically connected to the input multiplexer by an N-bit wide bus. In the illustrated example, N may equal 36. The first quad-port cache QPCACHE0 is illustrated as containing 4N bit cells, with each bit cell preferably configured as illustrated by FIGS. 3–4. The four groups of bit cells within QPCACHE0 are illustrated as groups #0–#3, with each group comprising 36 bit cells. Similarly, the second quad-port cache QPCACHE1 is illustrated as containing 4N bit cells as well. The four groups of bit cells within QPCACHE1 are illustrated as groups #4–#7.

As more fully described hereinbelow with respect to FIGS. 9–10, writing and reading operations independently toggle back and forth between QPCACHE0 and QPCACHE1. For example, upon start-up or the occurrence of a reset operation, 36-bit words of input data can be written in sequence into the data input registers within groups #0–#3 of the bit cells. During these initial write operations, the input data is also written in sequence into the retransmit registers within groups #0–#3 of the bit cells. This write data may be available immediately for reading by setting the control line RTPATH0 to a logic 1 level and thereby passing the write data to the data output register as the input data is received by QPCACHE0. This output data may then be passed from the data output register to an output multiplexer (OUTPUT MUX) and output register (OUTPUT REG). After four 36-bit words have been written into QPCACHE0, write control is passed to QPCACHE1 and the write data within the data input register (inside QPCACHE0) is written into the respective embedded memory array (SRAM ARRAY #0). Operations to read "recent" data within the data input registers or data previously stored in the embedded SRAM memory arrays may be performed while operations to write new input data into the data input registers of each quad-port cache are simultaneously being performed.

Figure 5:
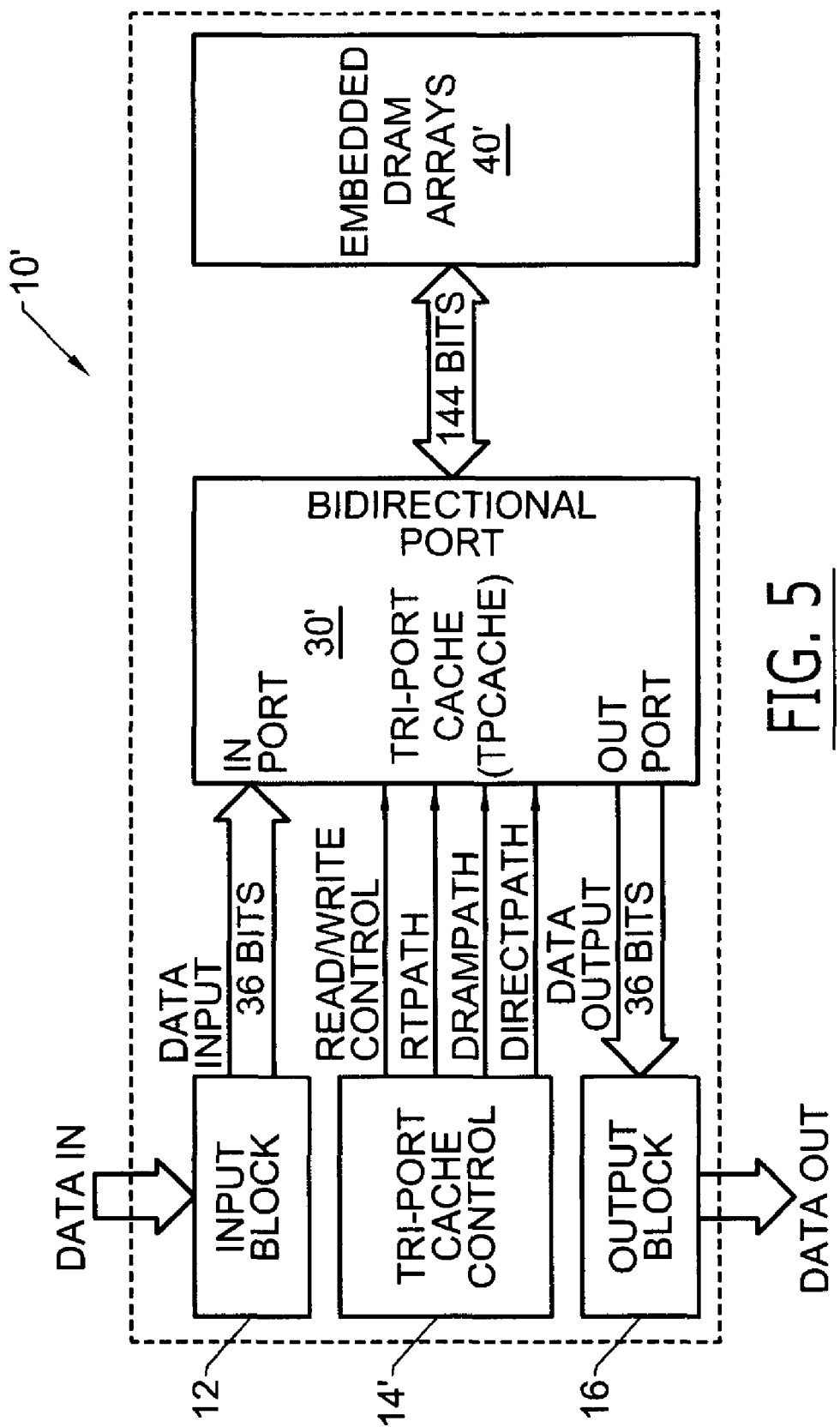
FIG. 5 is a block diagram of a buffer memory device according to embodiments of the present invention.
Figure 6:
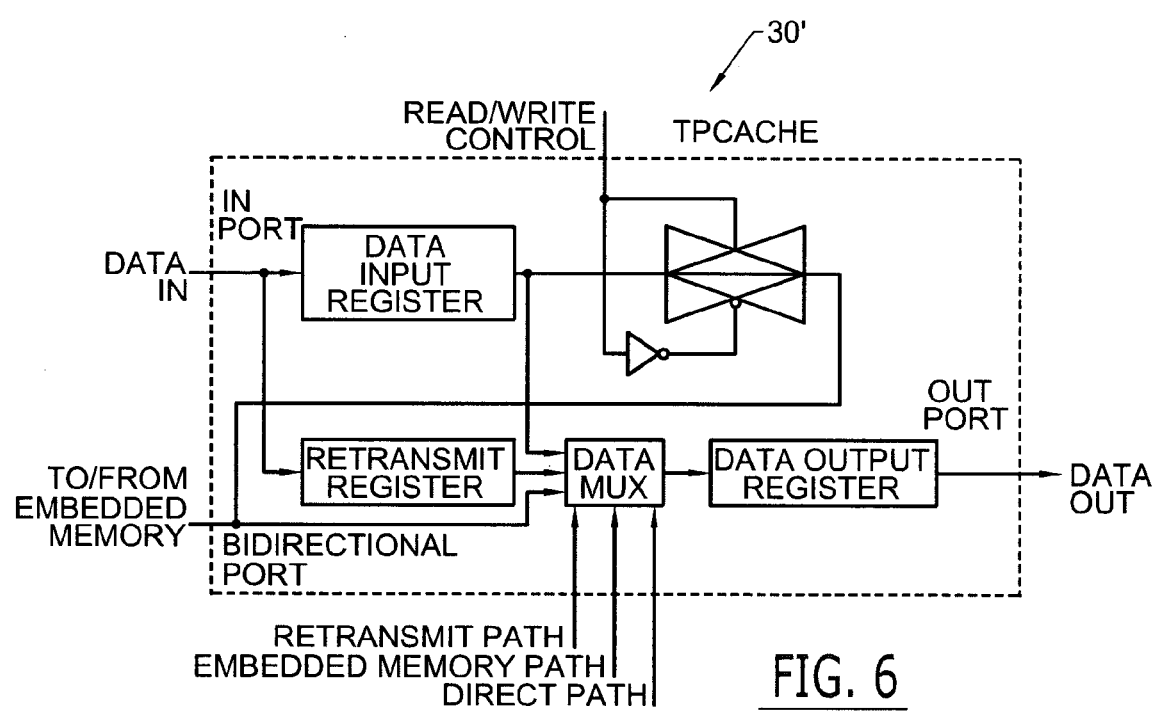
FIG. 6 is a block diagram of a cache bit cell according to embodiments of the present invention.
Figure 7:
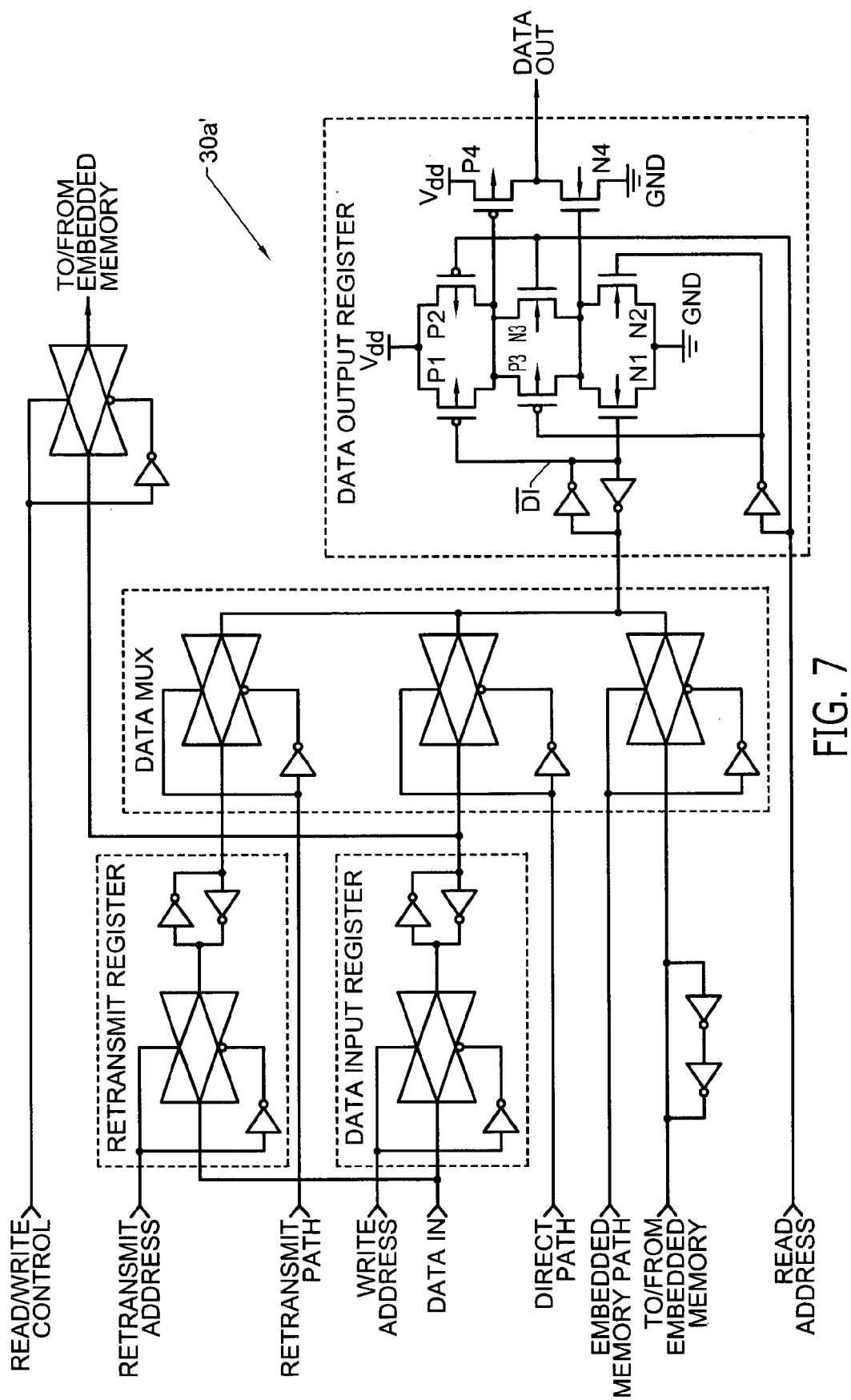
FIG. 7 is a detailed electrical schematic of the cache bit cell of FIG. 6.

Referring now to FIGS. 5–7, a buffer memory device 10' having a preferred tri-port cache 30' therein will be described. The buffer memory device 10' of FIG. 5 includes an input block 12, an embedded memory array 40' (shown as a DRAM array) and an output block 16. A tri-port cache control circuit 14' is also provided. Like the quad-port cache control circuit 14 of FIG. 1, the tri-port cache control circuit 14' generates a plurality of control signals (RTPATH, DRAMPATH and DIRECTPATH) and these control signals are provided to select inputs of a multiplexer within the tri-port cache 30'. Detailed block and electrical schematic diagrams of a bit cell 30a' within the tri-port cache 30' of FIG. 5, are illustrated in FIGS. 6–7. In addition, the tri-port cache control circuit 14' of FIG. 5 generates a read/write control signal, which facilitates proper operation of a bidirectional port and bidirectional bus connecting the tri-port cache 30' to the embedded memory array 40'. The read/write control signal is provided to a transmission gate that blocks data transfer between an output of the data input register and the bidirectional bus during a read operation, but enables data transfer during a write operation when the embedded memory array 40' is set in a mode to accept a page of write data from the bidirectional bus. This transmission gate is illustrated as a CMOS transmission gate in FIGS. 6–7.

Figure 8A:
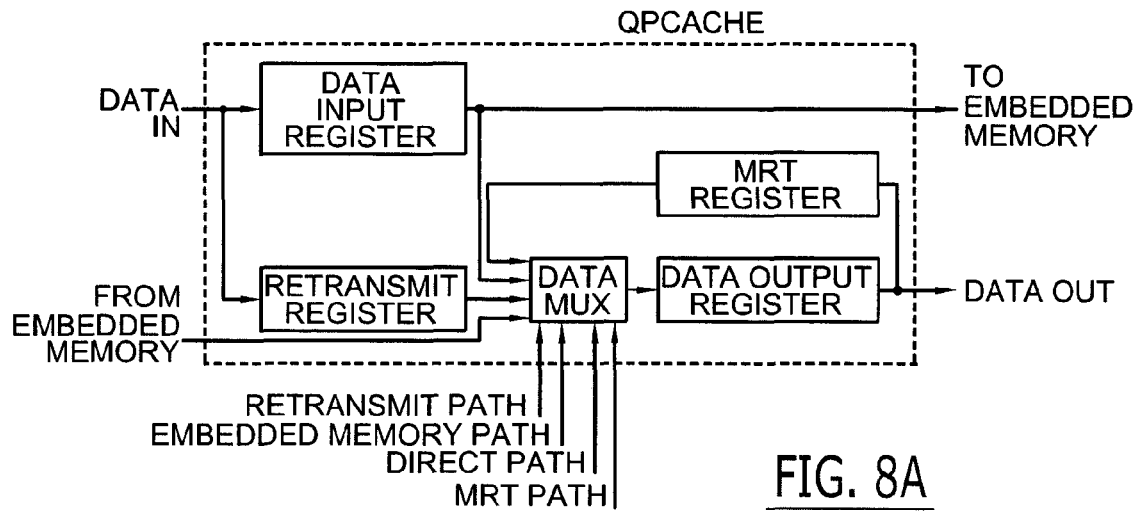
FIG. 8A is a block diagram of a quad-port cache bit cell according to embodiments of the present invention.
Figure 8B:
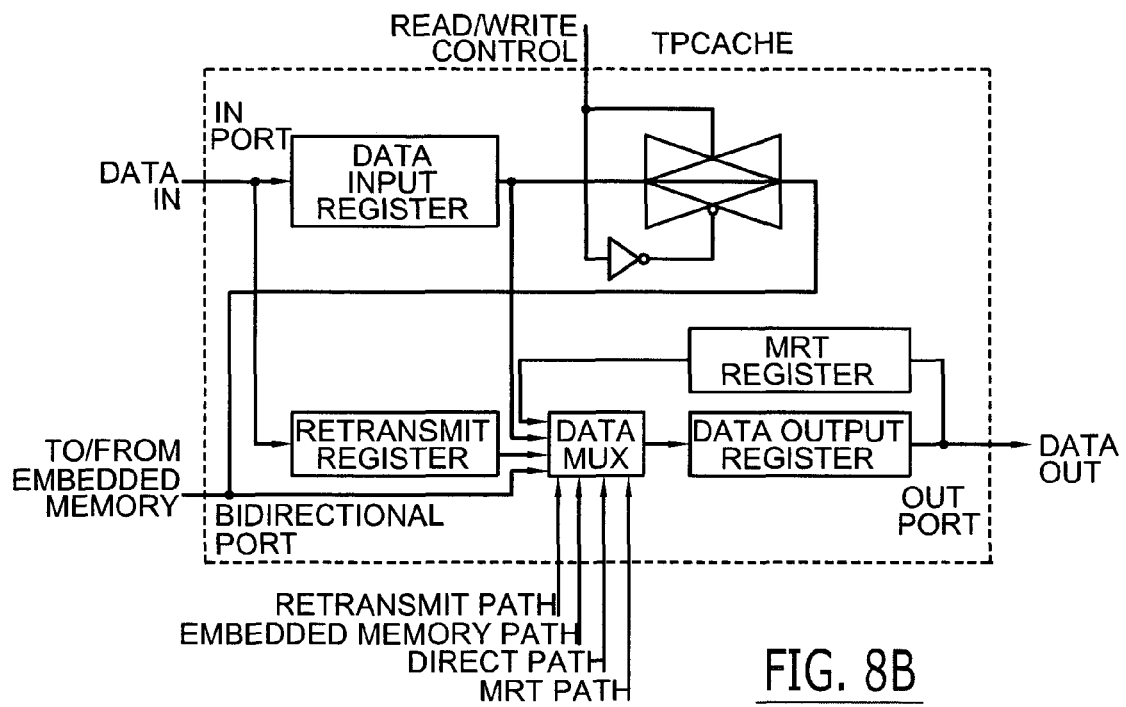
FIG. 8B is a block diagram of a tri-port cache bit cell according to embodiments of the present invention.

As illustrated by FIGS. 8A and 8B, the quad-port bit cell 30a of FIG. 3 and the tri-port bit cell 30a' of FIG. 6 can both be modified to include a retransmit from "mark" register (MRT register). This MRT register may have an internal structure similar to the retransmit register of FIGS. 4 or 7. This MRT register can be utilized within a preferred multi-port cache described herein, to store multiple data words (e.g., a page of data) following a mark request generated by a processor (not shown). This data can therefore be immediately available for retransmission through the data multiplexer and output register when a retransmit from mark (RFM) request is received by a buffer memory device containing the illustrated bit cells of FIGS. 8A–8B. The transfer of data from the output of the MRT register to an input of the data output register is enabled by setting the MRT PATH signal to a logic 1 level and thereby turning on a CMOS transmission gate within the data multiplexer.

Figure 9:
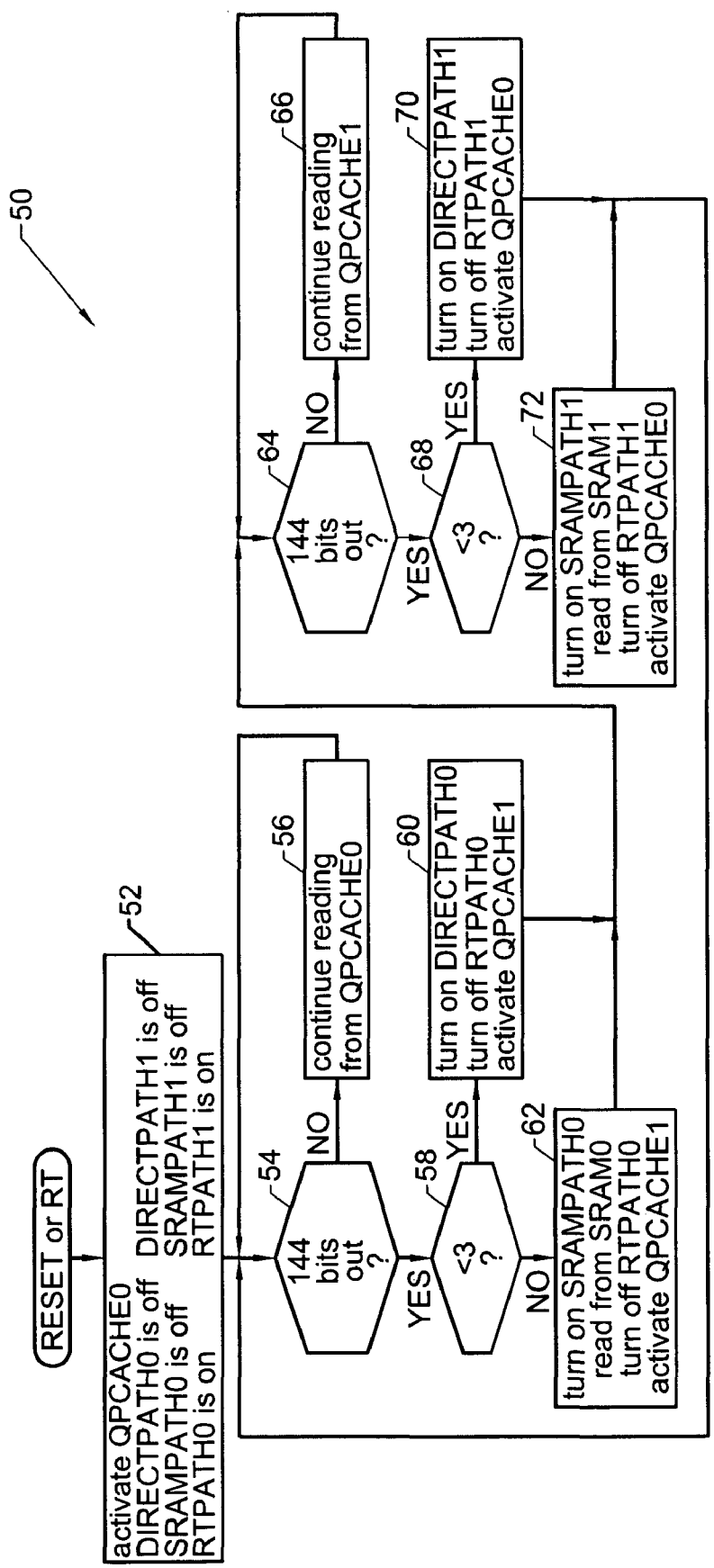
FIG. 9 is a flow-diagram of operations that illustrate preferred methods of reading from buffer memory devices.

FIG. 9 is a flow-diagram that illustrates preferred operations 50 that can be used when reading data from the multi-port buffer memory device of FIG. 2. Upon reset or receipt of a retransmit request signal (e.g., "retransmit from zero" signal), operations 52 may be performed to activate the first quad-port cache (QPCACHE0) and disable the direct path signals DIRECTPATH0 and DIRECTPATH1 (e.g., set the direct path signals to logic 0 levels). The embedded memory path signals (SRAMPATH0 and SRAMPATH1) are also disabled, but the retransmit path signals (RTPATH0 and RTPATH1) are enabled (e.g., set to logic 1 levels). These initial operations place the buffer memory device in a mode that enables data to be read from the retransmit registers. This data may comprise data that was written into the retransmit registers after the reset signal was received or data that was initially written into the retransmit registers during an active time period preceding generation of the retransmit request signal.

As illustrated by Blocks 54 and 56, a read data path is provided through the data multiplexer and the data output register within QPCACHE0 until all 144 bits of data (i.e., four 36-bit words) have been read from the retransmit register within QPCACHE0. However, once all initial 144 bits of data have been read from QPCACHE0, a check is made to determine whether a "less than three" flag (shown as "<3") is active, Block 58. This flag is active whenever a difference between the value of the write pointer (not shown) and a read pointer (not shown) in the embedded memory is less than three (3). Stated alternatively, an operation is performed at Block 58 to determine whether an additional page of data relative to the cache data (i.e., the data available for reading within QPCACHE0 and QPCACHE1) is available in the embedded memory array SRAM ARRAY #0. If the <3 flag is active, then the additional page of data is not available and the direct path signal DIRECTPATH0 is set to a logic 1 level and the signal RTPATH0 is made inactive, as illustrated by Block 60. This operation enables data written into the data input register within QPCACHE0 to be available for reading after the data within QPCACHE1 has been read. However, if an additional page of data is available in the embedded memory SRAM ARRAY #0, then a fetch (i.e., read) operation is performed from SRAM ARRAY #0 and signal SRAMPATH0 is set to a logic 1 level, Block 62. Signal RTPATH0 is also made inactive since the initial data within the retransmit register within QPCACHE0 has been completely read out.

Read control is then passed to QPCACHE1 and, as illustrated by Blocks 64 and 66, a continuous check is then made to determine whether all 144 bits of read data within the retransmit register in QPCACHE1 have been read. If all 144 bits have been read, then the <3 flag is checked again to determine whether an additional page of data relative to the current data in QPCACHE0 and QPCACHE1 is available in the embedded memory SRAM ARRAY #1, Block 68. If the <3 flag is active, which means an additional page of data is not available, the signal DIRECTPATH1 is set to an active level and signal RTPATH1 is made inactive, Block 70. However, if the <3 flag is not active, signal SRAMPATH1 is set to a logic 1 level, a fetch operation is performed from SRAM ARRAY #1 and signal RTPATH1 is made inactive, Block 72. Read control is then passed back to QPCACHE0 and operations commence to read data from either the data input register or from SRAM ARRAY #0. As illustrated by FIG. 9, these operations continue to toggle back and forth between QPCACHE0 and QPCACHE1 until the next reset or retransmit signal is received.

Figure 10:
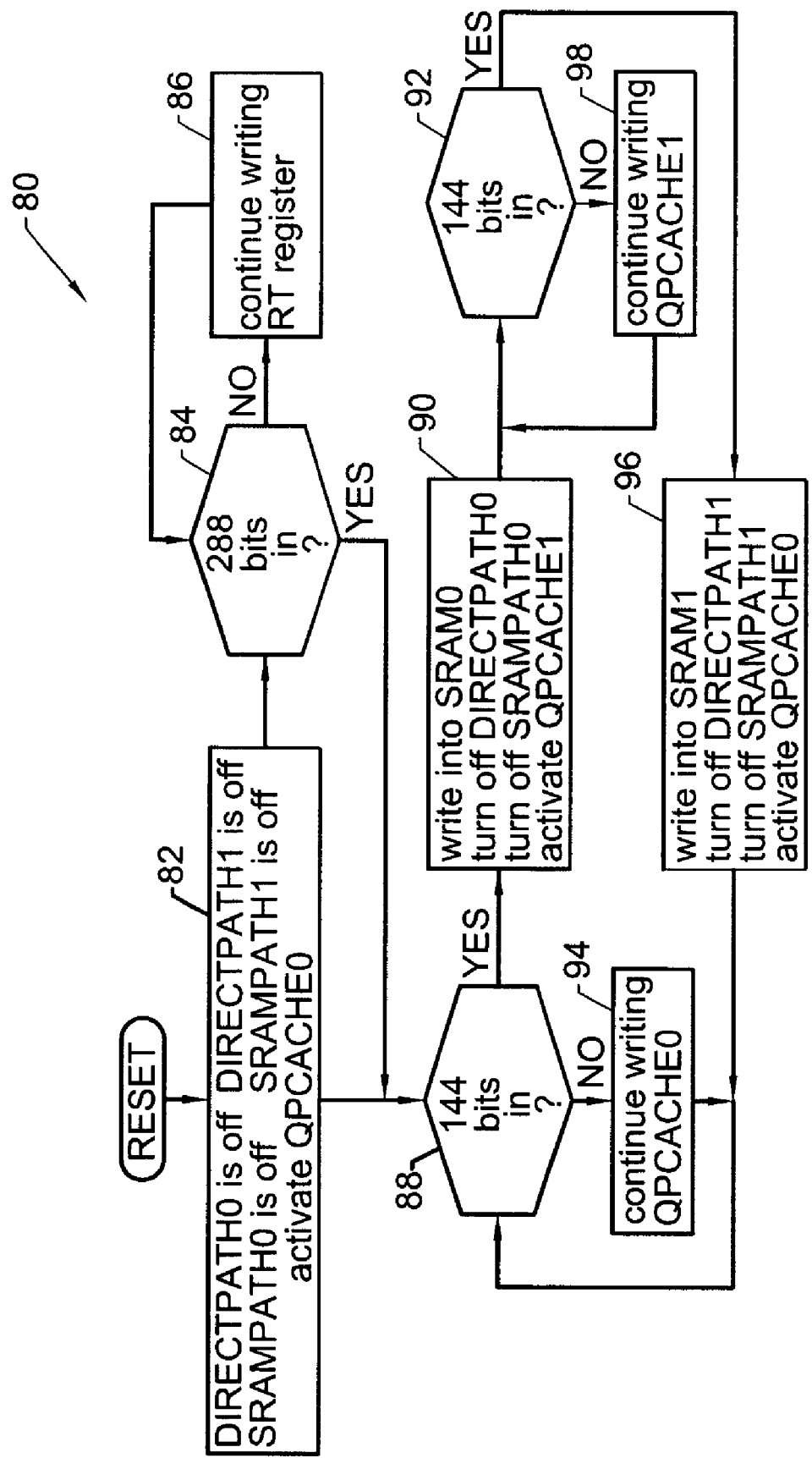
FIG. 10 is a flow-diagram of operations that illustrate preferred methods of writing to buffer memory devices.

The operations 80 of FIG. 10 for writing data to the multi-port buffer memory device of FIG. 2 may be less complex than the read operations illustrated by FIG. 9 because extensive write arbitration operations are typically not required to determine where subsequent write data is to be stored. This is because the next-to-write "register" is the data input register of the cache which is not receiving current write data. In contrast, alternative multi-port memory devices may utilize more extensive read and write arbitration operations to determine next-to-write and next-to-read registers on a continuous basis and also perform fetching operations to an embedded memory. These arbitration operations are more fully described in commonly assigned U.S. Pat. No. 6,216,205, the disclosure of which is hereby incorporated herein by reference.

Referring now to Block 82 of FIG. 10, upon reset, QPCACHE0 is activated to receive write data. Operations are also performed to disconnect the outputs of the data input registers within QPCACHE0 and QPCACHE1 from their respective output registers. This is done by inactivating DIRECTPATH0 and DIRECTPATH1. In addition, the data paths stemming from the embedded memory are also disconnected by inactivating SRAMPATH0 and SRAMPATH1. As illustrated by Blocks 84 and 86, retransmit addresses are applied to QPCACHE0 and QPCACHE1 to enable the storing of the first two pages (e.g., 288 bits) of write data in the retransmit registers. After the first two pages of write data have been stored in the retransmit registers, application of the retransmit addresses is disabled until a subsequent retransmit or reset request has been received. While the operations are being performed to write data into the retransmit registers, write data is also stored in the data input registers within QPCACHE0 and QPCACHE1. For example, at Blocks 88 and 94, data is initially written into QPCACHE0. Once an entire page of data has been written into QPCACHE0, an operation is performed to transfer the page of write data to the embedded memory (i.e., SRAM ARRAY #0) and control is passed to QPCACHE1, Block 90. Write operations are then performed by QPCACHE1 until another page of data has been received, Blocks 92 and 98. As illustrated by Block 96, the page of data within QPCACHE1 is then passed to the embedded memory (i.e., SRAM ARRAY #1) and write control is passed back to QPCACHE0. This back and forth toggling between QPCACHE0 and QPCACHE1 continues until a next reset operation is received.

Figure 11:
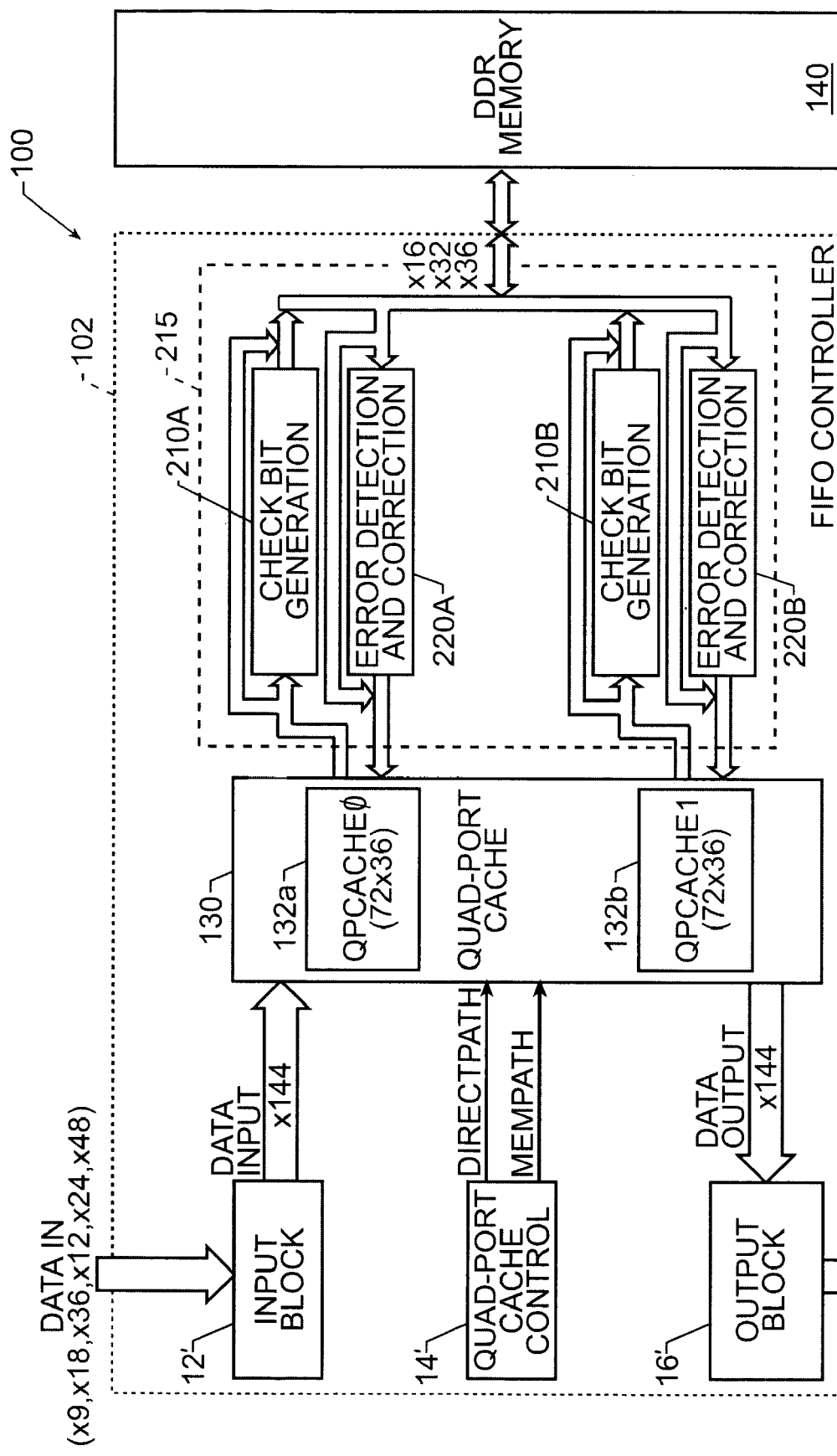
FIG. 11 is a block diagram of a FIFO memory device having a FIFO controller and off-chip supplemental memory device therein, according to embodiments of the present invention.

A buffer memory device according to further embodiments of the present invention may use a combination of integrated circuit memory devices that operate collectively as a FIFO memory device. One exemplary embodiment of a FIFO memory device 100 having a multi-chip configuration is illustrated by FIG. 11. This FIFO memory device 100 includes a FIFO controller 102, which may be formed on a first integrated circuit chip, and a supplemental memory device, which may be formed on a second integrated circuit chip. The supplemental memory device is illustrated as a dual data rate (DDR) memory device 140. In some embodiments of the present invention, the DDR memory device 140 may be a dynamic random access memory (DRAM) device or a static random access memory (SRAM) device. Memory devices that do not provide DDR operation may also be used as a supplemental memory device.

For purposed of discussion herein, the DDR memory device 140 will be treated as a DRAM memory device that requires periodic refreshing of entries therein. The FIFO controller 102 includes an input block 12', a quad-port cache control circuit 14' and an output block 16'. These components of the FIFO controller 102 are similar to the input block 12, quad-port cache control circuit 14 and the output block 16 illustrated by FIG. 1. As illustrated, the input block 12' receives input data (DATA IN) having a first data width and provides a quad-port cache 130 within FIFO write data (DATA INPUT) having a second data width (shown as 144 bits/word). The first data width may vary depending on application. Each 144-bit write word may be formed as sixteen 9-bit words, eight 18-bit words, four 36-bit words, twelve 12-bit words, six 24-bit words or three 48-bit words. The output block 16' is also configured to map each 144-bit read word (DATA OUTPUT) into a corresponding plurality of output data words (DATA OUT). As explained more fully hereinbelow, the quad-port cache control circuit 14' performs various control operations, including operations to generate the DIRECTPATH and MEMPATH control signals. These control signals are provided to multiplexer circuitry within the quad-port cache 130.

The quad-port cache 130 is illustrated as including two pages (e.g., two arrays) of quad-port cache memory cells. These two pages are illustrated as QPCACHE0 132*a* and QPCACHE1 132*b*. These two arrays of quad port cells have features similar to the quad-port cache devices QPCACHE0 and QPCACHE1 illustrated by FIG. 2. Each page is illustrated as having 72 rows and 36 columns (i.e., 72×36). Based on this configuration, each 144-bit write word (DATA INPUT) that is received by the quad-port cache 130 may be written into either QPCACHE0 or QPCACHE1 as two consecutive ×72 FIFO vectors. Similarly, each 144-bit read word (DATA OUTPUT) that is received from the quad-port cache 130 may result from operations to read two adjacent ×72 FIFO vectors from either QPCACHE0 or QPCACHE1.

A data transfer control circuit 215 is electrically coupled between a bidirectional output port of the FIFO controller 102 and various ports of the quad-port cache 130. The bidirectional output port of the FIFO controller 102 is illustrated as including a bidirectional bus, which is capable of handling ×16, ×32 and ×36 data words that can be written to or read from the DDR memory device 140. Data words having a width of 64 bits (×64) may also be provided in the event the quad-port cache 130 is a 72×36×2×2 device. The data transfer control circuit 215 is configured to perform various error detection and correction operations. In particular, the data transfer control circuit 215 includes a first check bit generation circuit 210A and a second check bit generation circuit 210B. When enabled, the first check bit generation circuit 210A operates to generate a plurality of check bits for each word that is transferred from QPCACHE0 132*a* to the DDR memory device 140 during a cache-to-memory data transfer operation. Similarly, the second check bit generation circuit 210B operates to generate a plurality of check bits for each word that is transferred from QPCACHE1 132*b* to the DDR memory device 140 during a cache-to-memory data transfer operation. These check bits may support the detection and correction of one (or more) errors when the corresponding word is read back from the DDR memory device 140 during a memory-to-cache data transfer operation. In some cases, the FIFO controller 102 may have a mode of operation that does not include check bit generation during a cache-to-memory data transfer operation, or error detection and correction during a memory-to-cache data transfer operation. Accordingly, circuitry may be provided so that both the first check bit generation circuit 210A and the second check bit generation circuit 210B may be bypassed. Operations and circuitry for generating check bits for a given word length are well known to those skilled in the art and need not be further described herein.

The data transfer control circuit 215 further includes a first error detection and correction (EDC) circuit 220A, which provides verified data (without check bits) to QPCACHE0 132*a*, and a second error detection and correction circuit 220B, which provides verified data (without check bits) to QPCACHE1 132*b*. In some cases, the FIFO controller 102 may have a mode of operation that does not include error detection and correction. Thus, circuitry may be provided so that both the first error detection and correction circuit 220A and the second error detection and correction circuit 220B may be bypassed. Additional embodiments of the FIFO controller 102 may include the error detection and correction circuits 220A and 220B, but omit (or bypass) the check bit generation circuits 210A and 210B. These embodiments may be useful in those applications where the input data (DATA IN) received by the input block includes its own check bit information. In this case, the EDC circuits 220A and 220B may be configured to pass check bit information to the cache.

Figure 12A:
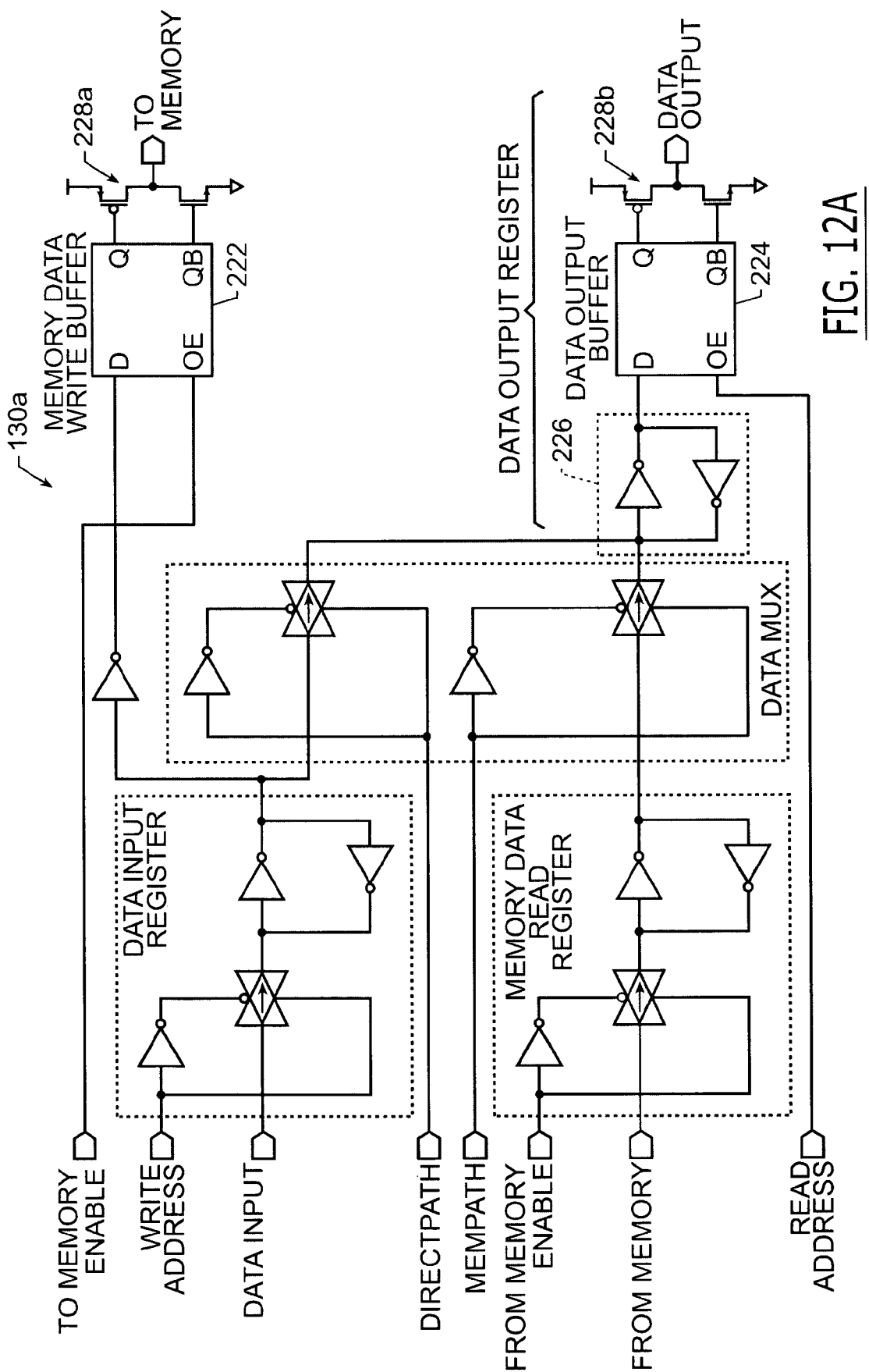
FIG. 12A is an electrical schematic of a quad-port memory cell that may be used in the FIFO controller illustrated by FIG. 11.

Each of the quad-port bit cells (QP-BC) within QPCACHE0 132*a* and QPCACHE1 132*b* may be configured as illustrated by the bit cell 130*a* of FIG. 12A, which is similar to the bit cell 30*a* of FIG. 4. The quad-port bit cell 130*a* has four ports, which include two unidirectional input ports and two unidirectional output ports. The input ports include a "data input" port (DATA INPUT), which receives FIFO write data from the input block 12', and a "from memory" port (FROM MEMORY), which receives "next-to-read" data that is being transferred from the DDR memory device 140 to the quad-port cache 130 during a memory-to-cache data transfer operation. This next-to-read data may be error checked and corrected by the error detection and correction circuits 220A or 220B. Alternatively, the incoming next-to-read data may bypass the error detection and correction circuits 220A and 220B. The two output ports include a "to memory" port (TO MEMORY), which is active when a page of recently written data is being transferred from the quad-port cache 130 to the DDR memory device 140 during a cache-to-memory data transfer operation, and a "data output" port (DATA OUTPUT), which is configured to transfer FIFO read data from either QPCACHE0 132*a* or QPCACHE1 132*b* to the output block 16'.

A data input register and memory data read register are provided to store the FIFO write data and the "next-to-read" data received from the DDR memory device 140, respectively. The data input register is illustrated as including a transmission gate, which is responsive to a write address, and a latch. Similarly, the memory data read register is illustrated as including a transmission gate, which is responsive to an enable signal (shown as FROM MEMORY ENABLE) and a latch. A 2-input data multiplexer (DATA MUX) is also provided. The data multiplexer can be configured so that the FIFO write data is directly passed (as FIFO read data) to the data output port (DATA OUTPUT), to thereby support fast fall through capability. This configuration is achieved by setting the direct path signal (DIRECT-PATH) to an active high level. Alternatively, the 2-input data multiplexer can be configured so that data retrieved from the DDR memory device 140 is available for reading at the data output port. This latter configuration is achieved by setting the memory path signal (MEMPATH) to an active high level. The output of the data multiplexer is connected to an inverting latch 226. An output of the latch 226 is electrically coupled to an input of a data output buffer 224, which is responsive to a read address (READ ADDRESS). The data output register 224 has a pair of complementary outputs (shown as Q and QB) that are provided to a driver device 228*b*. The combination of the latch 226, the data output buffer 224 and the driver device 228*b* is identical to the data output register of FIG. 4.

A memory write path is also provided within the quad-port bit cell 130*a*. This memory write path extends from an output of the data input register to an input of a memory data write buffer 222. The memory write path also includes an inverter and a driver device 228*a*, which is connected to complementary outputs of the memory data write buffer 222. The memory data write buffer 222 is responsive to a memory enable signal (TO MEMORY ENABLE). When the memory enable signal is set to an active high level, FIFO write data is passed from the data input register to the "to memory" port (TO MEMORY). Thus, regardless of how the data multiplexer (DATA MUX) is set, the receipt of an active memory enable signal will enable transfer of FIFO write data from the quad-port cache 130 to the DDR memory device 140.

Figure 12B:
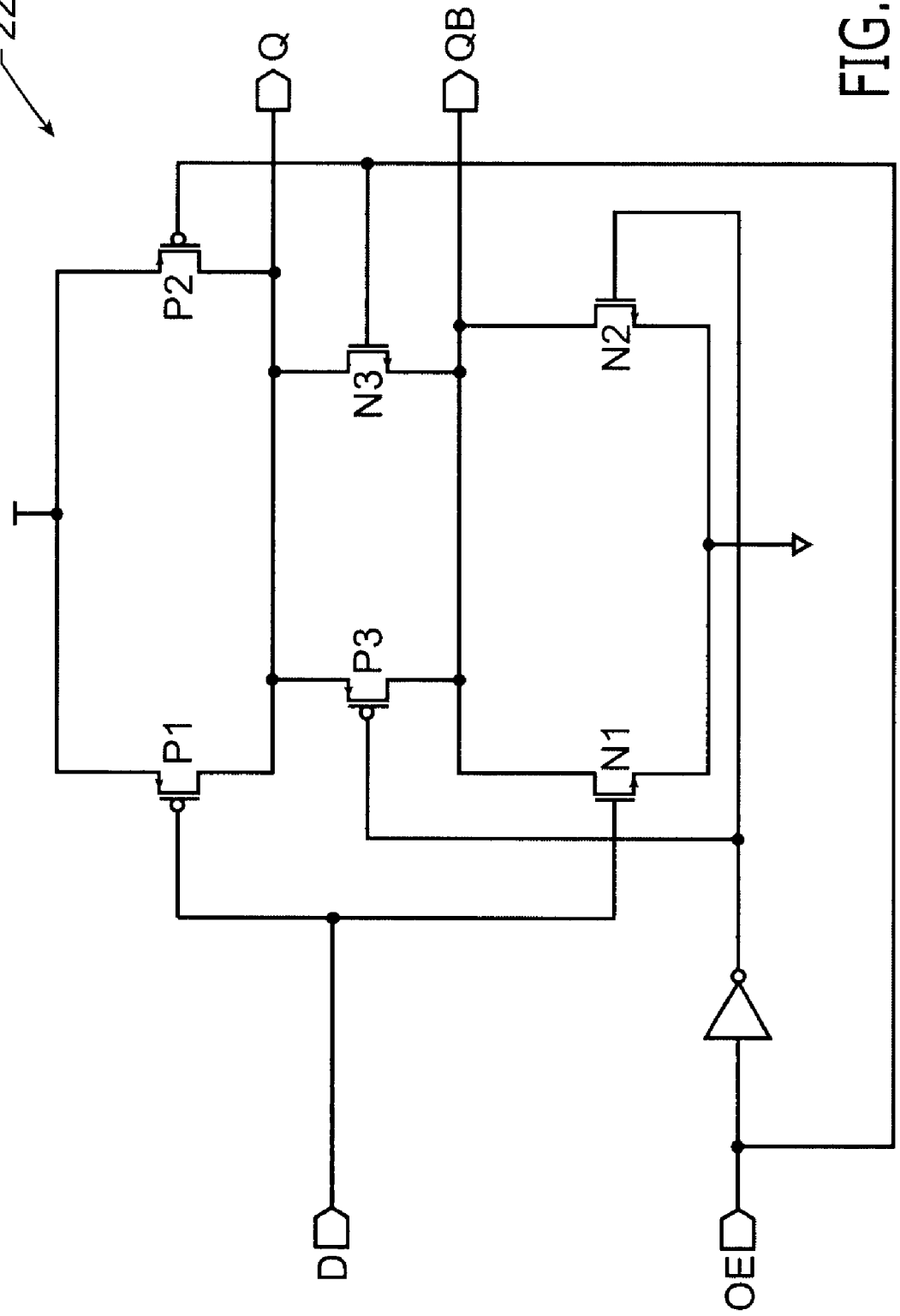
FIG. 12B is an electrical schematic of an embodiment of a buffer, which may be used as illustrated by FIG. 12A.

FIG. 12B is an electrical schematic of a register that may be used as the memory data write buffer 222 and the data output buffer 224. The register is illustrated as including PMOS transistors P1–P3 and NMOS transistors N1–N3. When an input signal (D) is set to a high level, NMOS transistor N1 is turned on and the complementary output QB is pulled (or held) low. If the output enable signal OE is set high to an active level, then NMOS transistor N3 and PMOS transistor P3 will both be turned on and the true output Q will be pulled low by NMOS transistor N1. When this occurs, both the true and complementary outputs Q and QB will be set low and the output of the driver device 228b will be pulled high to reflect the high level of the input signal D. However, if the input signal D is set to a low level when the output enable signal OE is set high, then PMOS transistor P1 will be turned on and the true output will be pulled high. The complementary output QB will also be pulled high by NMOS transistor N3 and PMOS transistor P3. This will cause the output of the driver device 228b to be pulled low. Finally, when the output enable signal OE is set low, the true output Q will be pulled high and the complementary output QB will be pulled low and the output of the driver device 228b will be disposed in a high impedance state.

Figure 13:
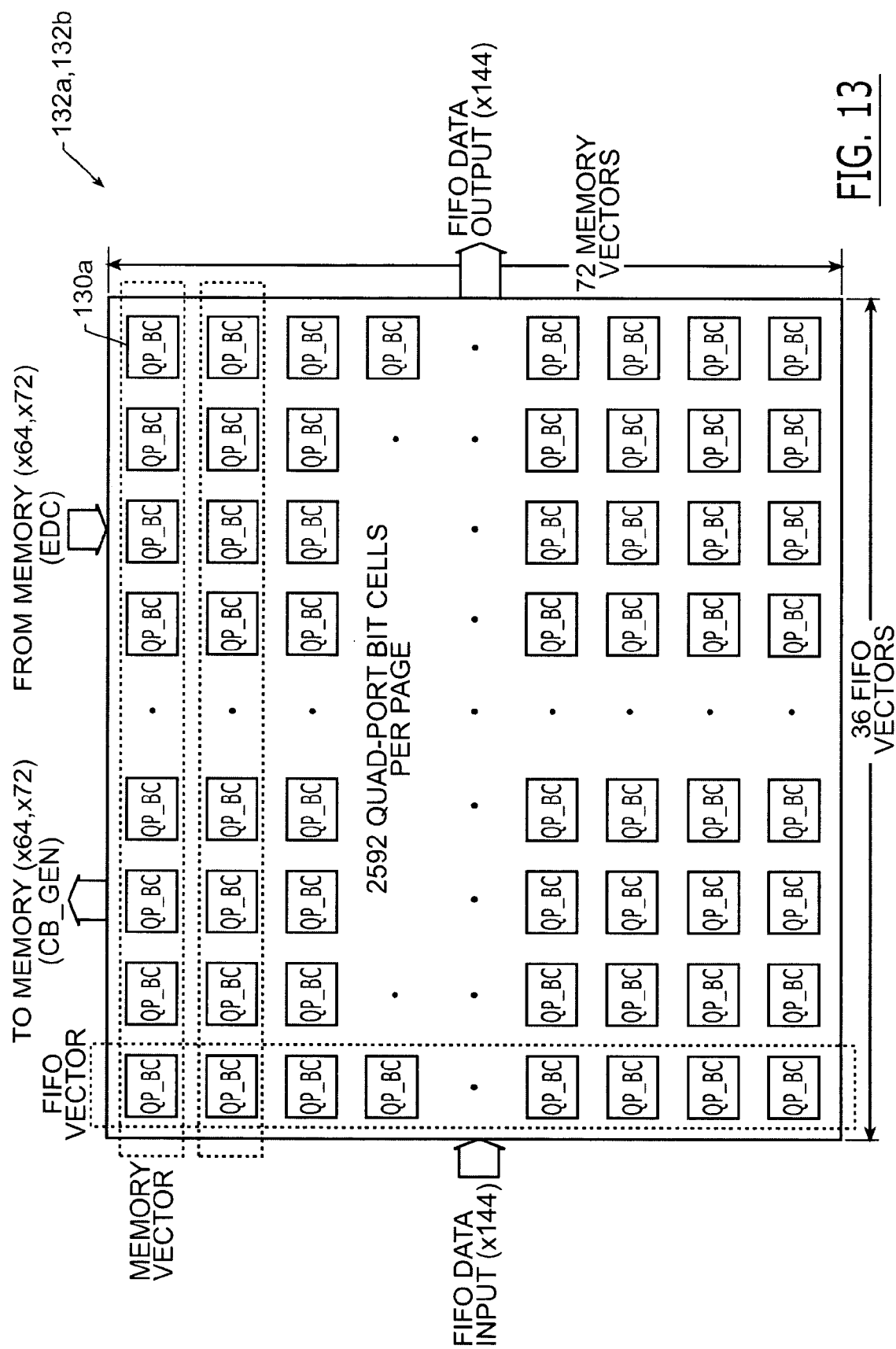
FIG. 13 is a block diagram of a page of quad-port memory cells that may be used in the quad-port cache illustrated by FIG. 11.

FIG. 13 illustrates an arrangement of quad-port bit cells (QP_BC) within a page of the quad-port cache 130. Thus, as illustrated, QPCACHE0 132a and QPCACHE1 132b may each contain a total of 2592 bit cells that span 72 rows and 36 columns. Each of the 36 columns of bit cells is configured to retain a respective FIFO vector having a data width equal to 72 bits. Each of the 72 rows of bit cells is configured to retain a respective memory vector having a maximum data width equal to 36 bits. The data input port (DATA INPUT) and the data output port (DATA OUTPUT) illustrated in the bit cell 130a of FIG. 12A correspond to the FIFO data input port (FIFO DATA INPUT (×144)) and FIFO data output port (FIFO DATA OUTPUT (×144)) illustrated in FIG. 13. Accordingly, each FIFO write word (having 144 bits) can be written into two adjacent columns within the illustrated page of quad-port cells and each FIFO read word can be read from two adjacent columns. This means that a maximum of 18 FIFO write words (144 bits/word) can be written into an empty page before it becomes full. This maximum value of 18 FIFO write words is reduced to 16 FIFO write words in the event the DDR memory device 140 is configured to accept 32-bit words instead of 36-bit words. These 16 FIFO write words may be treated as filling the 32 leftmost columns in the illustrated page, whereas 18 FIFO write words may be treated as filling all 36 columns of the illustrated page.

The "to memory" port (TO MEMORY) and the "from memory" port (FROM MEMORY) illustrated in the bit cell 130a of FIG. 12A correspond to the "to memory" port (TO MEMORY (×64, ×72)) and the "from memory" port (FROM MEMORY (×64, ×72)) illustrated at the top FIG. 13. Accordingly, in the event the DDR memory device 140 accepts 32-bit words, then a maximum of 72 32-bit memory vectors (corresponding to 36 64-bit words) can be transferred out of the page during a cache-to-memory data transfer operation. This cache-to-memory data transfer operation may include passing the page of data through one of the check bit generation circuits (CB GEN) illustrated by FIG. 11. Alternatively, if the DDR memory device 140 accepts 36-bit words, then a maximum of 72 36-bit memory vectors (corresponding to 36 72-bit words) can be transferred out of the page during a cache-to-memory data transfer operation. The same relationships apply to the filling of a page of quad-port bit cells during memory-to-cache data transfer operations (i.e., when a page is being loaded with next-to-read data from the DDR memory device 140). This memory-to-cache data transfer operation may include passing the page of data through one of the error detection and correction circuits (EDC) illustrated by FIG. 11. Nonetheless, as explained more fully hereinbelow, the operations illustrated FIG. 9 enable the FIFO read operations to be performed without any EDC latency.

By configuring the page of cache according to the layout of FIG. 13, efficient bus matching characteristics may be achieved using data rotation operations (horizontal-to-vertical and vertical-to-horizontal). For example, the illustrated page enables 32 or 36 ×72 FIFO vectors to be written into and read from columns of the page during FIFO write and read operations, respectively. Moreover, the page enables 72 ×32 or ×36 (or other widths) memory vectors to be read from or written to rows of the page during cache-to-memory and memory-to-cache data transfer operations, respectively. These operations represent vertical transfer operations. Because of the data rotation operations, each of the memory vectors will retain one bit of data from a corresponding ×72 FIFO vector. Accordingly, each filled row of memory cells within the DDR memory device 140 may retain a memory vector that contains one bit of data from 32 or 36 distinct FIFO vectors.

The cache-to-memory and memory-to-cache data transfer operations require the DDR memory device 140 to undergo write and read operations, respectively. The timing of these operations is controlled by the FIFO controller 102. Moreover, in the event the DDR memory device 140 is a DRAM device, the FIFO controller 102 may also be required to control the timing of periodic refresh operations within the DRAM device. The timing of these operations: DDR read, DDR write and DDR refresh, may occur in any sequence and may repeatedly change sequence and frequency throughout operation. For example, if the FIFO memory device 100 is undergoing many write operations but very few read operations during a particular time interval, then the DDR memory device 140 will undergo many consecutive write and refresh operations that are interleaved, but very few read operations. Alternatively, if the FIFO memory device 100 is undergoing many read operations but very few write operations during a particular time interval, then the DDR memory device 140 will undergo many consecutive read and refresh operations, but very few write operations. Moreover, whereas the frequency of the refresh operations may be a dictated by particular requirements of the DDR memory device 140, the frequency, timing and order of the write and read operations will be influenced by the frequency at which the FIFO memory device 100 is accessed by external devices (not shown). This precludes the FIFO controller 102 from controlling all aspects of the read and write request signal generation.

Figure 15A:
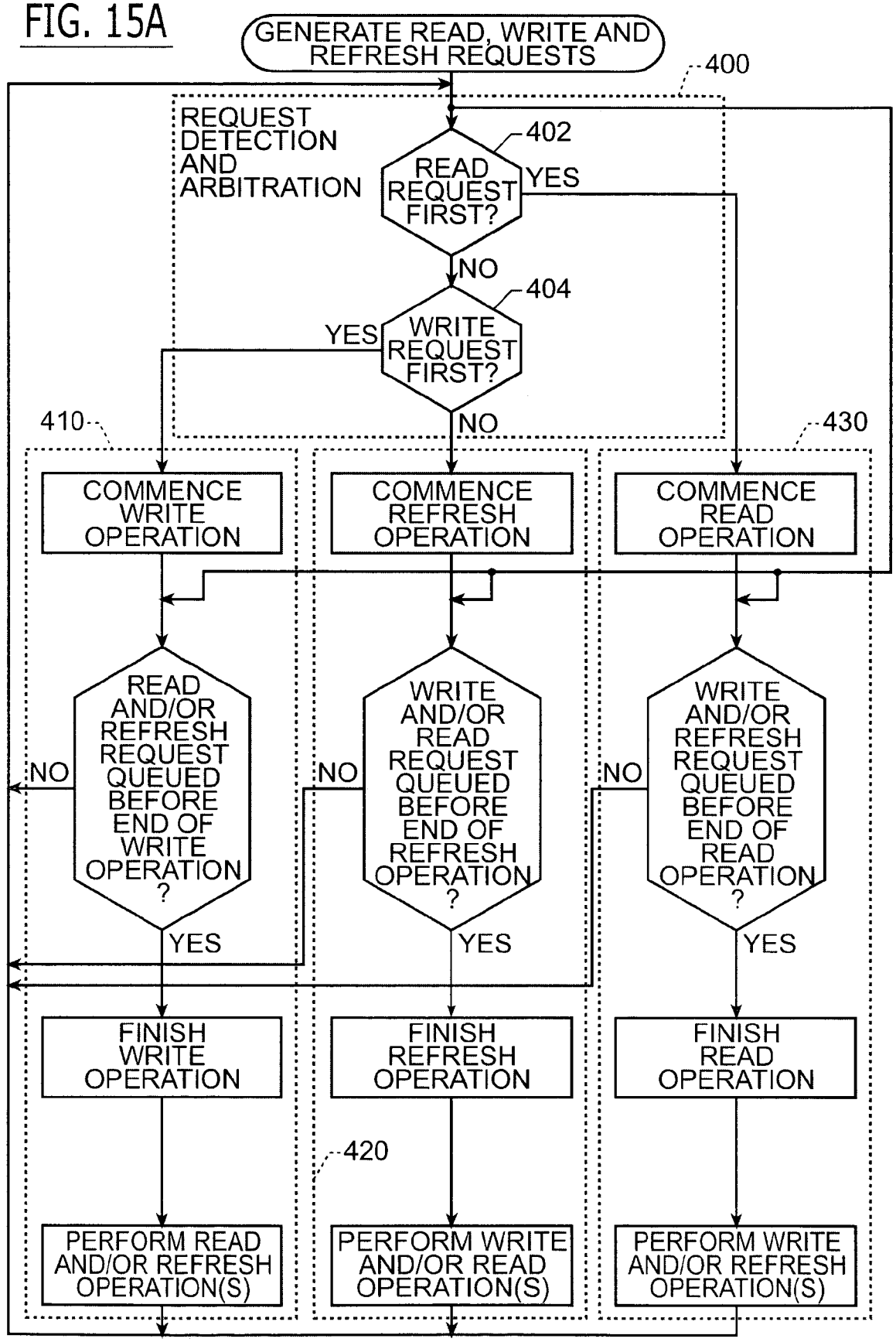
FIG. 15A is a flow diagram that illustrates request signal arbitration operations according to embodiments of the present invention.

FIGS. 15A–15D and 16A–16H illustrate operations to arbitrate the timing of when read, write and refresh commands are issued to the DDR memory device 140, in response to the asynchronous generation of read, write and refresh requests within the FIFO controller 102. In FIG. 15A, request detection and arbitration operations 400 are performed in response to any order or timing of read, write and refresh requests. As illustrated by Blocks 402 and 404, checks are initially made to arbitrate between read, write and refresh requests in order to detect which request came first in time. If a read request was generated first, then operations associated with Block 430 are performed. However, if a write request was generated first, then operations associated with Block 410 are performed. Finally, if a refresh request was generated first, then operations associated with Block 420 are performed.

As illustrated by Block 410 in FIG. 15A, if a write request is detected as a first request, then a write command is issued to the DDR memory device 140 and write operations are commenced. These write operations represent a portion of the cache-to-memory data transfer operations. Following detection of the write request, a continuous check is made to determine whether any other requests (read or refresh) are made prior to completion of the write operations. If no other requests are made prior to completion, then control is passed to the request detection and arbitration operations, Block 400. However, if another request is made, then operations associated with the additional request(s) are performed after completion of the write operation. The operations performed by Block 410 are more fully illustrated by FIG. 15B.

As illustrated by Block 430 in FIG. 15A, if a read request is detected as a first request, then a read command is issued to the DDR memory device 140 and read operations are commenced. These read operations represent a portion of the memory-to-cache data transfer operations. Following detection of the read request, a continuous check is made to determine whether any other requests (write or refresh) are made prior to completion of the read operations. If no other requests are made prior to completion, then control is passed to the request detection and arbitration operations, Block 400. However, if another request is made, then operations associated with the additional request(s) are performed after completion of the read operation. The operations performed by Block 430 are more fully illustrated by FIG. 15C.

As illustrated by Block 420 in FIG. 15A, if a refresh request is detected as a first request, then a refresh command is issued to the DDR memory device 140 and refresh operations are commenced within the DDR memory device 140. Following detection of the refresh request, a continuous check is made to determine whether any other requests (write or read) are made prior to completion of the refresh operations. If no other requests are made prior to completion, then control is passed to the request detection and arbitration operations, Block 400. However, if another request is made, then operations associated with the additional request(s) are performed after completion of the refresh operation. The operations performed by Block 420 are more fully illustrated by FIG. 15D.

Figure 15B:
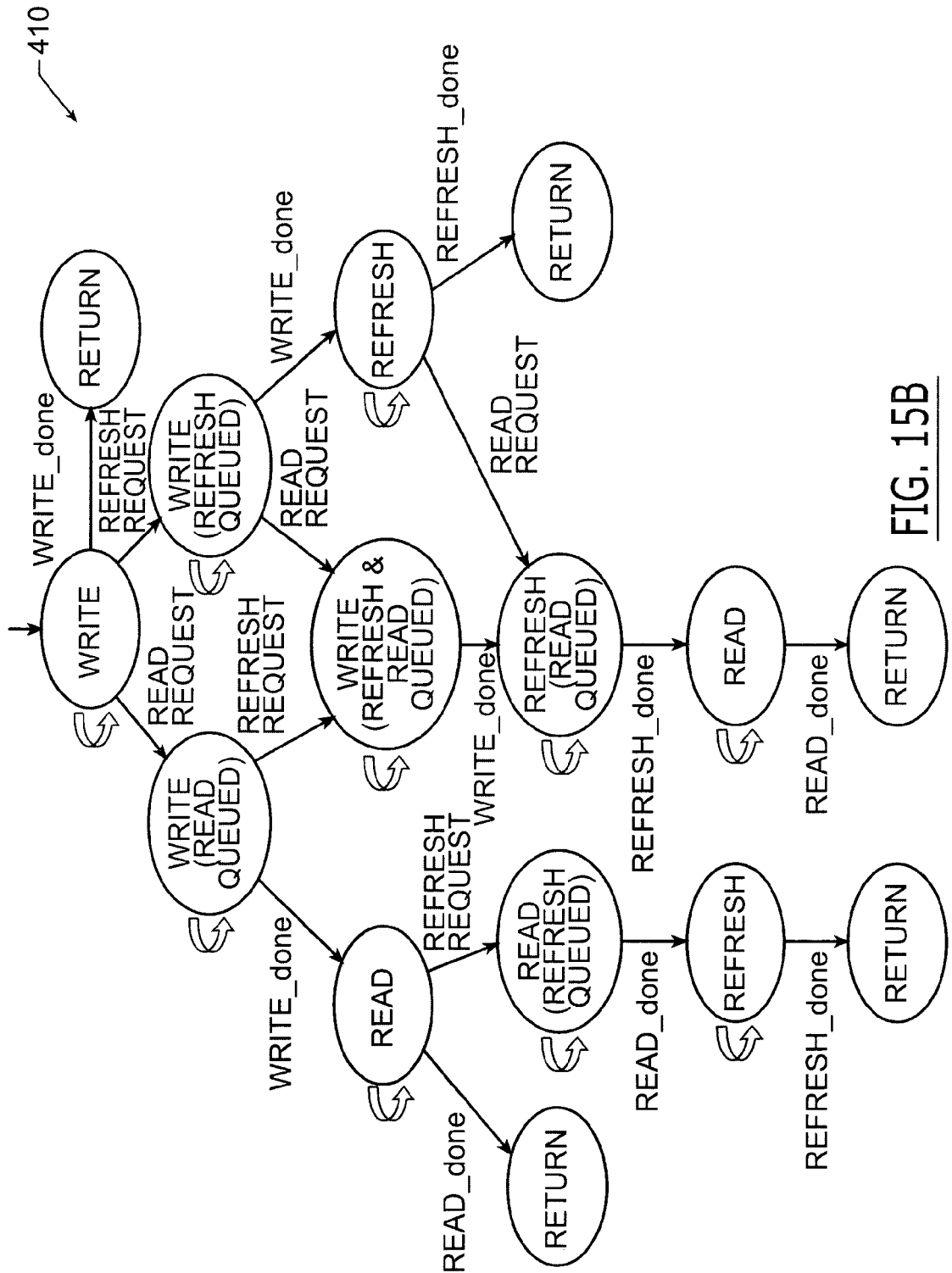
FIG. 15B is a detailed flow diagram that illustrates a portion of the request signal arbitration operations of FIG. 15A.

FIG. 15B is a flow diagram that illustrates detection of a write request as a first request followed by various read and refresh request timing combinations. In response to detection of a write request as a first request, a write command is issued by the FIFO controller 102 and write operations are performed as part of a cache-to-memory data transfer. If the write operations are completed before either a read or refresh request is detected, then control is returned to Block 400. This sequence is illustrated at the top of FIG. 15B, where write operations are performed and then a WRITE_done signal is generated to signify completion of the write operations.

Referring now to the left side of FIG. 15B, a read request may be received prior to completion of the write operations. If this occurs, then the read request is queued while further write operations are performed. If the write operations are completed prior to receipt of any refresh request, then read operations will be commenced. If the read operations are completed prior to receipt of any refresh request, then a READ_done signal is generated to signify completion of the read operations and then control is returned to Block 400. However, if a refresh request is received prior to completion of the read operations, then the refresh request will become queued until such time as the read operations are completed. Once the read operations have been completed and the READ_done signal has been issued, the refresh operations will be performed. Upon completion of the refresh operations, a REFRESH_done signal is generated and control is returned to Block 400.

On the other hand, if a read request is received during write operations and then followed by a refresh request prior to completion of the write operations, the refresh and read requests will both be queued and the queued refresh request will have higher queue priority. Thus, upon completion of the write operations, refresh operations will be commenced while the earlier received read request remains queued because it has lower queue priority. This lower queue priority of the read request (and any write request) relative to a queued refresh request enables the refresh operations to be performed as soon as possible after a refresh request has been made. This insures that any requested refresh operation is performed in a timely manner so that data is not lost within the DDR memory device 140 for failure to timely refresh. The generation of a REFRESH_done signal signifies completion of the refresh operations and prompts commencement of operations responsive to the remaining queued read request.

Referring now to the right side of FIG. 15B, a refresh request may be received prior to completion of the write operations. If this occurs, then the refresh request is queued while further write operations are performed. If the write operations are completed prior to receipt of any read request, then refresh operations will be commenced. If the refresh operations are completed prior to receipt of any read request, then a REFRESH_done signal is generated to signify completion of the refresh operations and control is returned to Block 400. On the other hand, if a refresh request is received and then followed by a read request prior to completion of the write operations, the refresh and read requests will both be queued and the queued read request will have lower queue priority. Thus, upon completion of the write operations, refresh operations will be commenced while the later received read request remains queued. Once the refresh operations have been performed and a REFRESH_done signal is generated, then the read operations will be performed in response to the queued read request. Control is returned to Block 400 upon generation of the READ_done signal.

Figure 15C:
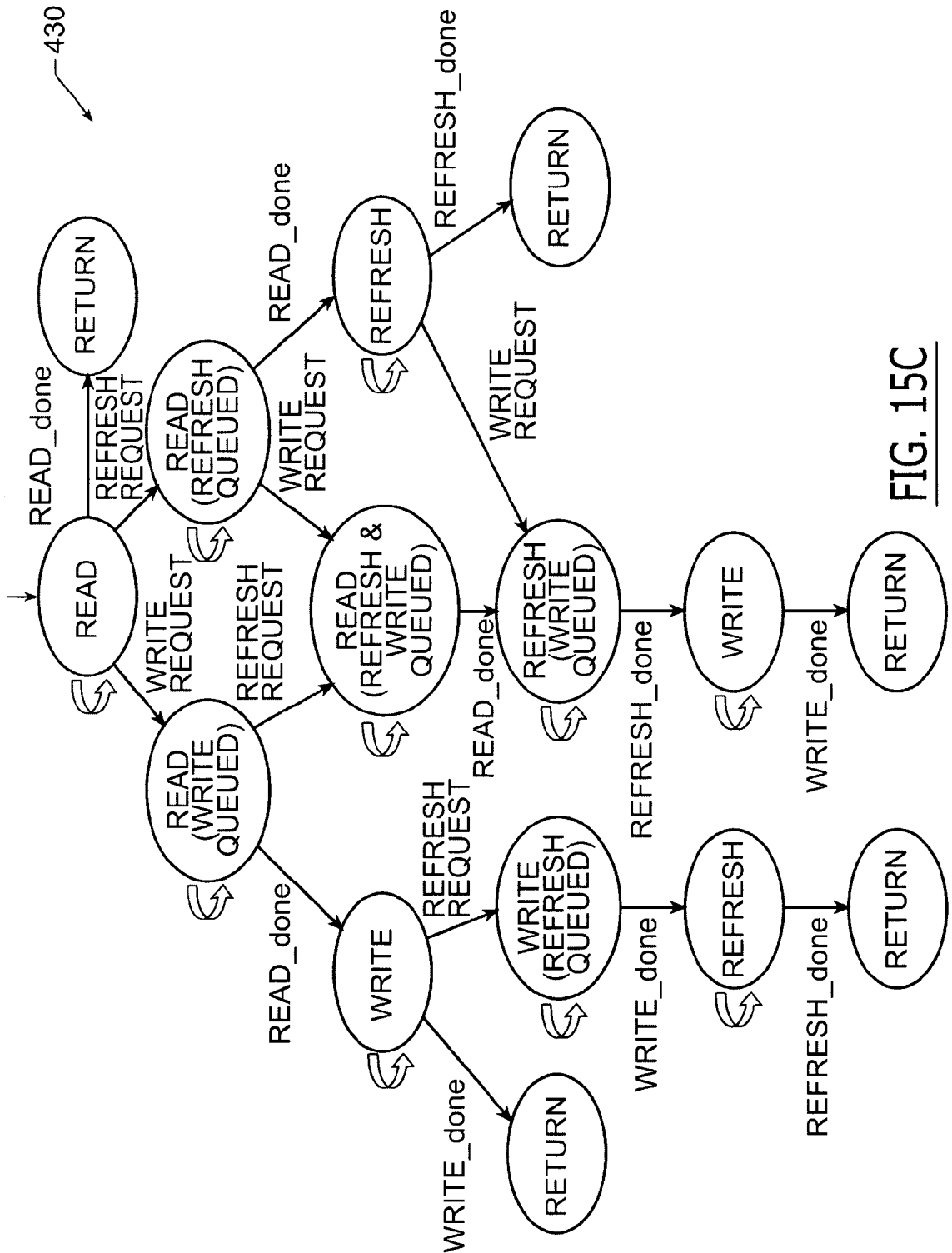
FIG. 15C is a detailed flow diagram that illustrates a portion of the request signal arbitration operations of FIG. 15A.

FIG. 15C is a flow diagram that illustrates detection of a read request as a first request followed by various write and refresh request timing combinations. In response to detection of a read request as a first request, a read command is issued by the FIFO controller 102 and read operations are performed as part of a memory-to-cache data transfer. If the read operations are completed before either a write or refresh request is detected, then control is returned to Block 400. This sequence is illustrated at the top of FIG. 15C, where read operations are performed and then a READ_done signal is generated to signify completion of the read operations.

Referring now to the left side of FIG. 15C, a write request may be received prior to completion of the read operations. If this occurs, then the write request is queued while further read operations are performed. If the read operations are completed prior to receipt of any refresh request, then write operations will be commenced upon completion of the read operations. If the write operations are completed prior to receipt of any refresh request, then a WRITE_done signal is generated to signify completion of the write operations and then control is returned to Block 400. However, if a refresh request is received prior to completion of the write operations, then the refresh request will become queued until such time as the write operations are completed. Once the write operations have been completed and the WRITE_done signal has been issued, the refresh operations will be performed. Upon completion of the refresh operations, a REFRESH_done signal is generated and control is returned to Block 400.

On the other hand, if a write request is received during read operations and then followed by a refresh request prior to completion of the read operations, the refresh and write requests will both be queued and the queued refresh request will have higher queue priority. Thus, upon completion of the read operations, refresh operations will be commenced while the earlier received write request remains queued because it has lower queue priority. The generation of a REFRESH_done signal signifies completion of the refresh operations and prompts commencement of operations responsive to the remaining queued write request.

Referring now to the right side of FIG. 15C, a refresh request may be received prior to completion of the read operations. If this occurs, then the refresh request is queued while further read operations are performed. If the read operations are completed prior to receipt of any write request, then refresh operations will be commenced. If the refresh operations are completed prior to receipt of any write request, then a REFRESH_done signal is generated to signify completion of the refresh operations and control is returned to Block 400. On the other hand, if a refresh request is received and then followed by a write request prior to completion of the read operations, the refresh and write requests will both be queued and the queued write request will have lower queue priority. Thus, upon completion of the read operations, refresh operations will be commenced while the later received write request remains queued. Once the refresh operations have been performed and a REFRESH_done signal is generated, then the write operations will be performed in response to the queued write request. Control is returned to Block 400 upon generation of the WRITE_done signal.

Figure 15D:
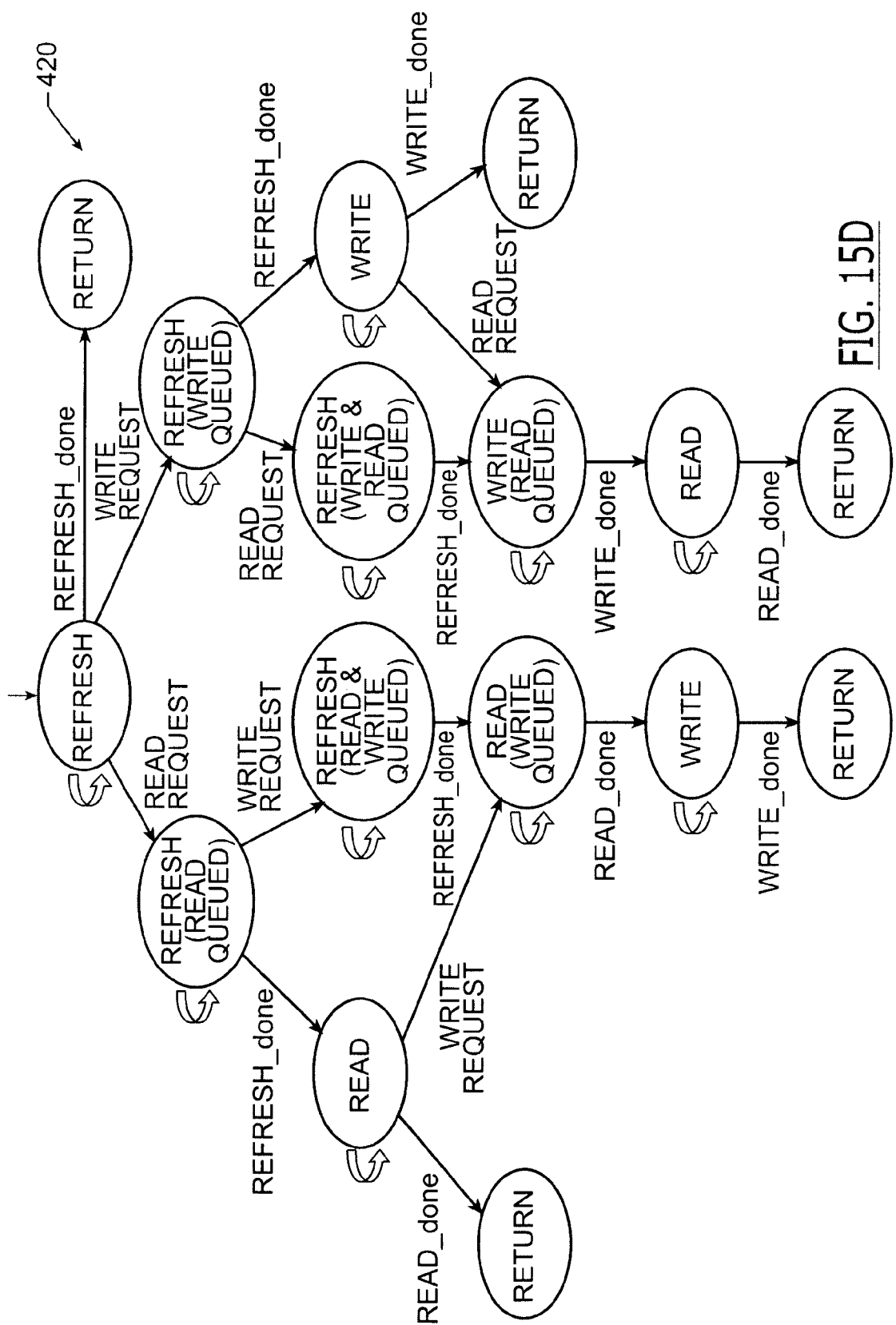
FIG. 15D is a detailed flow diagram that illustrates a portion of the request signal arbitration operations of FIG. 15A.

FIG. 15D is a flow diagram that illustrates detection of a refresh request as a first request followed by various write and read request timing combinations. Because the read and write requests have equivalent queue priorities, the right side of FIG. 15D, which follows a write request being received after the refresh request, is similar to the left side of FIG. 15D, which follows a read request being received after the refresh request. In the flow diagram of FIG. 15D, the read and write requests are queued so that operations associated with the earlier of the two received requests is performed before operations associated with the later received request are performed.

Thus, in FIG. 15D, if a REFRESH_done signal is generated prior to receipt of any read or write request, then control is returned to Block 400 upon completion of the refresh operations. However, if only a write request is received prior to completion of the refresh operations, then the write request is queued and write operations are performed upon completion of the refresh operations (i.e., when the REFRESH_done signal is generated). If no read request is received while the write operations are being performed, then control will be passed to Block 400 upon completion of the write operations, as illustrated by the right side of FIG. 15D. But, if a read request is received prior to completion of the write operations, then read operations will be performed in response to generation of the WRITE_done signal. Finally, if a write request and then a read request are queued prior to completion of the refresh operations, then the write operations will be performed in response to generation of the REFRESH_done signal and read operations will be performed in response to generation of the WRITE_done signal.

In contrast, if only a read request is received prior to completion of the refresh operations, then the read request is queued and read operations are performed upon completion of the refresh operations (i.e., when the REFRESH_done signal is generated). If no write request is received while the read operations are being performed, then control will be passed to Block 400 upon completion of the read operations, as illustrated by the left side of FIG. 15D. But, if a write request is received prior to completion of the read operations, then write operations will be performed in response to generation of the READ_done signal. Finally, if a read request and then a write request are queued prior to completion of the refresh operations, then the read operations will be performed in response to generation of the REFRESH_done signal and write operations will be performed in response to generation of the READ_done signal.

The read operations from the DDR memory device 140 represent a subset of the memory-to-cache data transfer operations and the memory-to-cache data transfer operations represent a subset of the operations to read FIFO vectors from the quad-port cache 130. During the memory-to-cache data transfer operations, pages of read data from the DDR memory device 140 are routed through the error detection and correction (EDC) circuits 220A and 220B in an alternating sequence that is 180 degrees out-of-phase relative to the operations to read FIFO vectors from QPCACHE0 132*a* and QPCACHE1 132*b*, which are also performed in an alternating back-and-forth sequence between the pages of cache. This out-of-phase relationship enables the latency associated with passing read data through the first EDC circuit 220A or the second EDC circuit 220B to be hidden entirely from the operations to read FIFO vectors from the quad-port cache 130. For example, when reading FIFO vectors from QPCACHE0 132*a*, the memory vectors within QPCACHE1 132*b* are being filled with next-to-read data that has been error checked. Similarly, when reading FIFO vectors from QPCACHE1 132*b*, the memory vectors within QPCACHE0 132*a* are being filled with next-to-read data that has been error checked. Thus, any EDC latency associated with filling memory vectors in one page of cache during a memory-to-cache data transfer operation is hidden from operations to read FIFO vectors from another page of cache. These FIFO read operations generally follow those illustrated by FIG. 9, with the exception that the signals RTPATH0 and RTPATH1 do not apply to the quad-port cache and quad-port bit cell of FIGS. 11 and 12A (the signals SRAMPATH0 and SRAMPATH1 apply to corresponding MEMPATH signals within QPCACHE0 132*a* and QPCACHE1 132*b*). Nonetheless, in some alternative embodiments, the quad-port cache 130 of FIG. 11 may be modified to include retransmit features similar to those illustrated in FIGS. 1, 3–4 and 8.

The arbitration operations illustrated by the flow diagrams of FIGS. 15A–15D are further illustrated by the timing diagrams of FIGS. 16A–16H. These timing diagrams illustrate timing of the following signals: PAGEWCLK, PAGERCLK, REFCLK, MEMCLK, MEMWRITE_START, MEMREAD_START, REFRESH_START, WRITE_DONE, READ_DONE and REF_DONE. The signals PAGEWCLK, PAGERCLK and REFCLK are generated as active high pulses to indicate a write request, a read request and a refresh request. The signal MEMCLK is a periodic clock signal, which is illustrated as having a frequency equal to 166.67 MHz. The request signals are asynchronously timed relative to each other. For example, the timing of a write request is a function of the frequency and number of FIFO write operations being performed on the quad-port cache 130 and the timing of a read request is a function of the frequency and number of FIFO read operations being performed on the quad-port cache 130. As will be understood by those skilled in the art, the timing of the FIFO write operations and the timing of FIFO read operations are controlled by separate external devices (not shown) that are frequently not synchronized with each other. Moreover, the refresh request signal REFCLK is generated periodically in response to the counting of a clock signal that is independent of the FIFO write operations and FIFO read operations. Accordingly, the timing of the write, read and refresh requests can occur in any order with and without timing overlap, as illustrated by FIGS. 16A–16H.

The signals MEMWRITE_START, MEMREAD_START and REFRESH_START are generated by a multi-request arbitration control circuit. These signals, which are generated as active high pulses, are made active during nonoverlapping time intervals. While active, these "start" signals signify the commencement and continuation of operations relating to cache-to-memory data transfer operations (MEMWRITE_START), memory-to-cache data transfer operations (MEMREAD_START) and refresh operations (REFRESH_START). These "start" signals are synchronized with MEMCLK. Finally, the signals WRITE_DONE, READ_DONE and REF_DONE are active low signals that are received by the multi-request arbitration control circuit when a respective write, read or refresh operation has been completed.

In FIG. 16A, the illustrated sequence of requests includes a write request, a read request and then a refresh request (i.e., a write-then-read-then-refresh sequence). These requests are spaced apart in time and may suggest a write, read and refresh sequence of operations within the DDR memory device 140. However, because the refresh request, which is an active high REFCLK pulse, occurs prior to completion of the write operation (i.e., while MEMWRITE_START is active at a high level), the refresh request becomes queued at a higher priority relative to the previously queued read request. Accordingly, as illustrated by FIGS. 16A and 15B, the refresh operations are commenced upon completion of the write operations and then the read operations are commenced upon completion of the refresh operations.

In FIGS. 16B and 15B, the illustrated sequence of requests includes a write request, a refresh request and then a read request (i.e., a write-then-refresh-then-read sequence). This sequence results in the performance of write operations, then refresh operations and then read operations. In this case, the order in which the requests are queued is also the order in which operations associated with the requests are performed. In other words, no requests are taken out of order because of a higher queue priority.

Figure 16C:
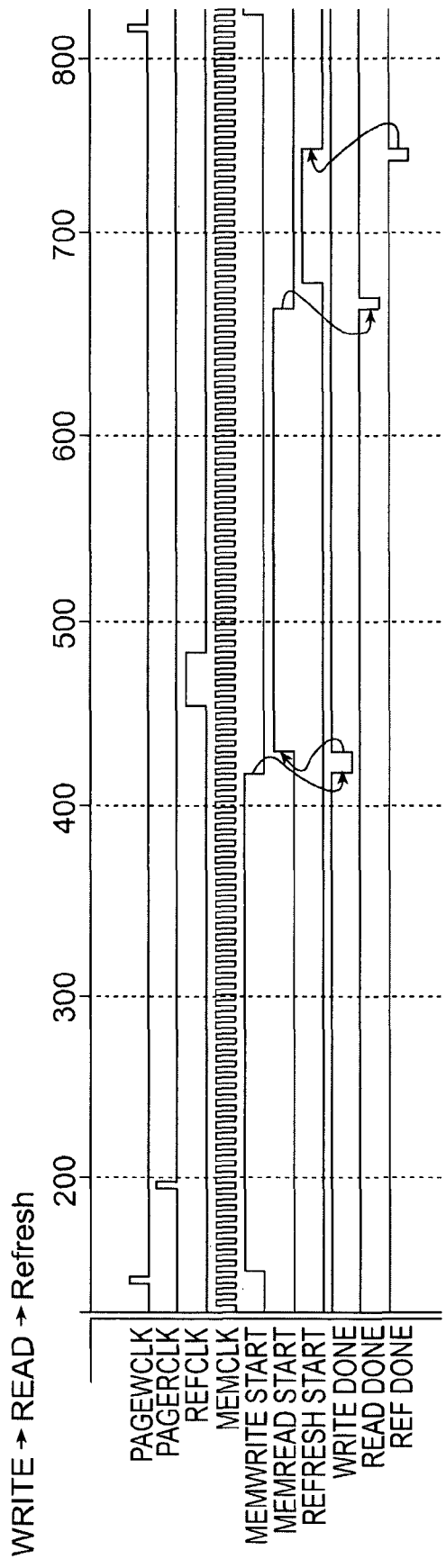

In FIGS. 16C and 15B, the illustrated sequence of requests includes a write request, a read request and then a refresh request (i.e., a write-then-read-then-refresh sequence). However, the refresh request occurs after the write operations have been performed. Accordingly, the previously queued read request is used to commence read operations upon completion of the write operations and the refresh request is queued during these read operations.

Figure 16D:
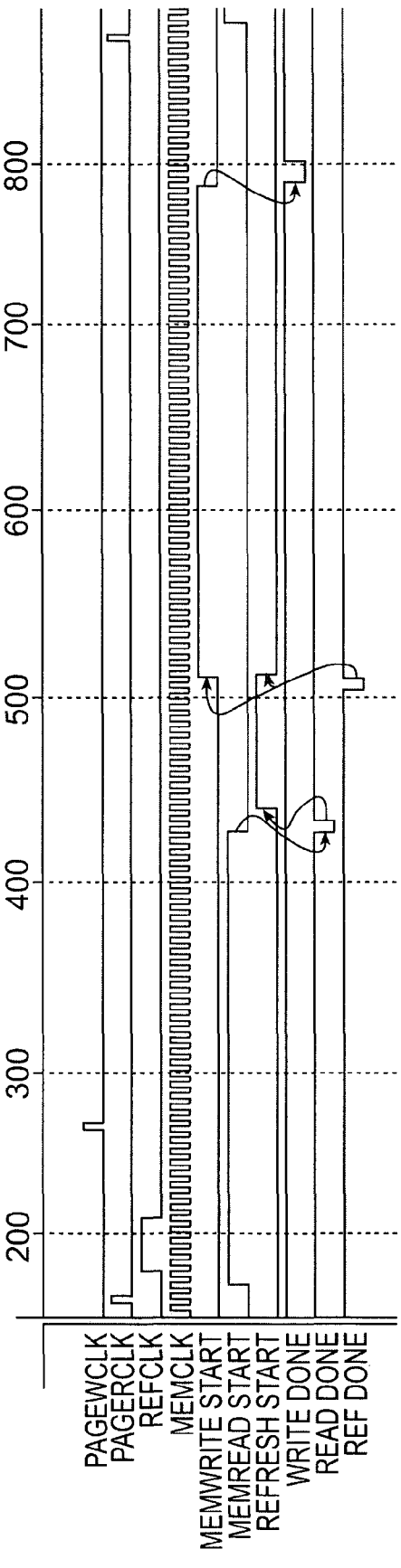

In FIGS. 16D and 15C, the illustrated sequence of requests is similar to the sequence shown in FIG. 16B, however, the timing of the write and read requests is reversed. In particular, FIG. 16D shows a sequence that includes a read request, a refresh request and then a write request (i.e., a read-then-refresh-then-write sequence). This sequence results in the performance of read operations, then refresh operations and then write operations. In this case, the order in which the requests are queued is also the order in which operations associated with the requests are performed, with no requests being taken out of order because of a higher queue priority.

Figure 16E:
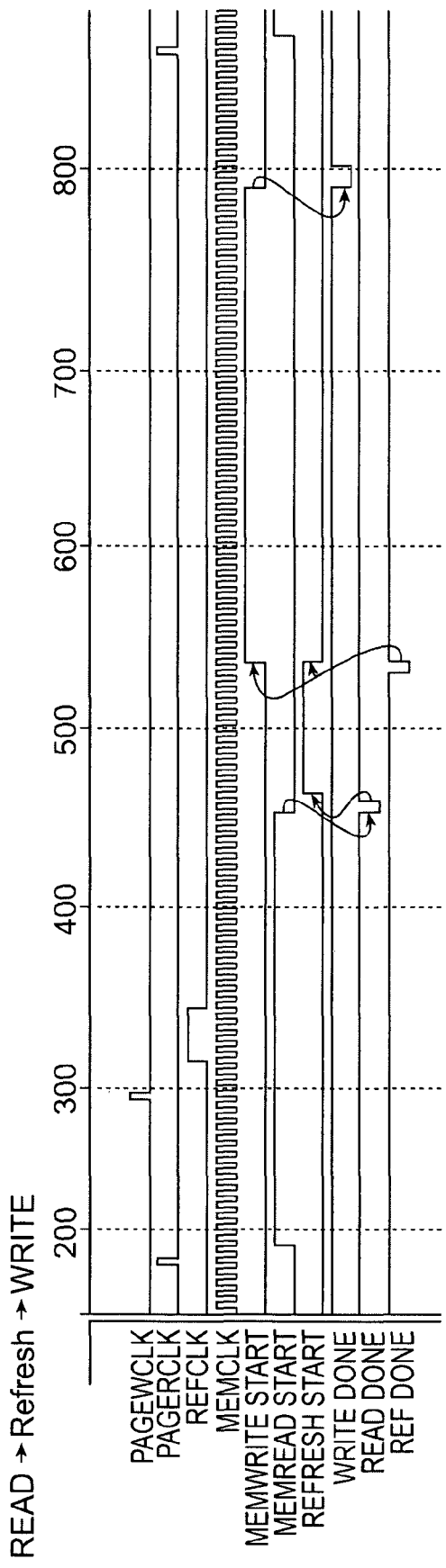

In FIGS. 16E and 15C, the illustrated sequence of requests includes a read request, a write request and a refresh request (i.e., a read-then-write-then-refresh sequence). This sequence results in the performance of read operations, then refresh operations and then write operations. The refresh operations are performed before the write operations because the refresh request was made prior to completion of the read operations and the refresh request has higher queue priority relative to a queued write request.

Figure 16F:
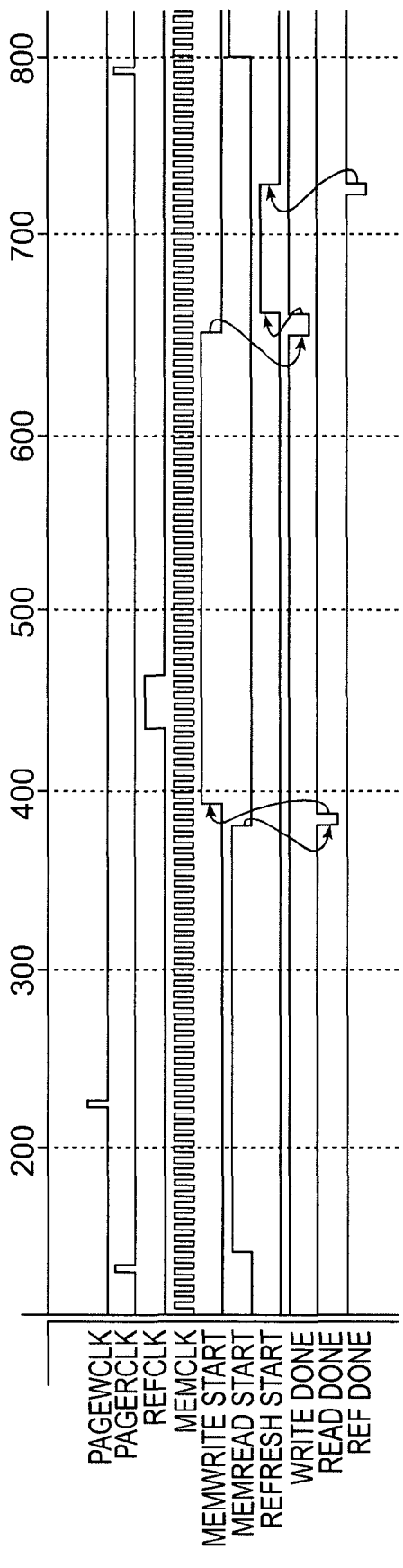

In FIGS. 16F and 15C, the illustrated sequence of requests includes a read request, a write request and then a late refresh request (i.e., a read-then-write-then-refresh sequence). This sequence results in the performance of read operations, then write operations and then refresh operations. In this case, the order in which the requests are queued is also the order in which operations associated with the requests are performed. In particular, because the refresh request occurs after completion of the read operations, the earlier queued write request results in the commencement of write operations upon completion of the read operations.

Figure 16G:
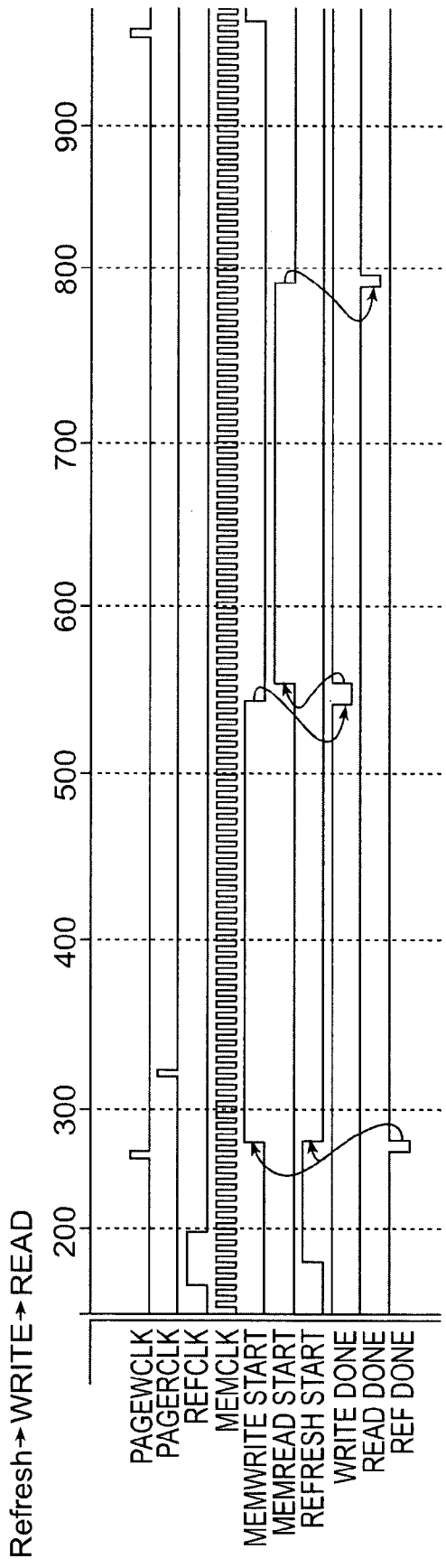
Figure 16H:
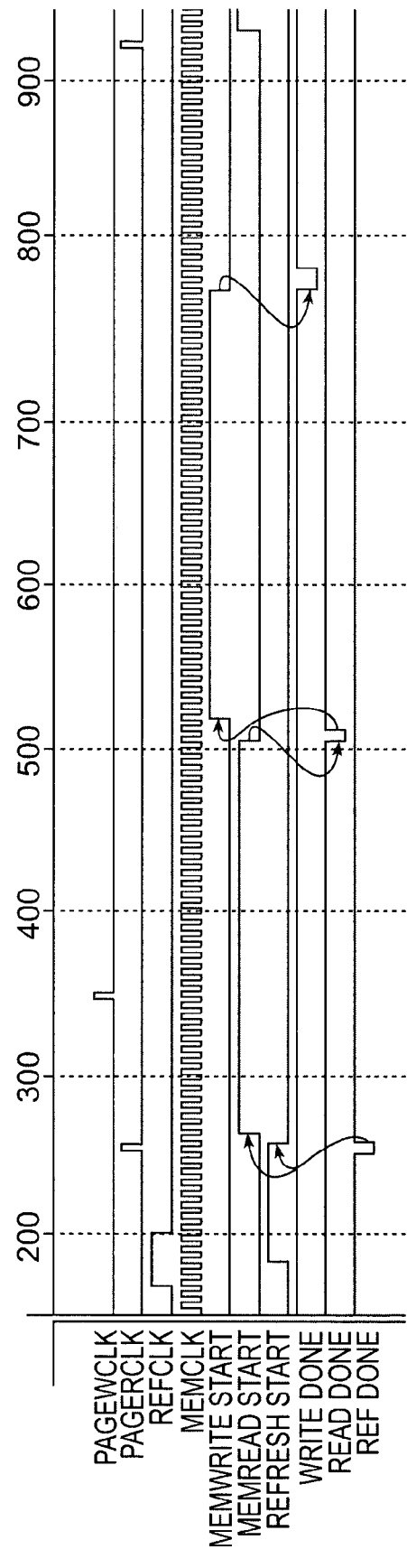

In FIGS. 16G and 15D, the illustrated sequence of requests includes a refresh request, a write request and a read request (i.e., a refresh-then-write-then-read sequence). This sequence results in the performance of refresh operations, then write operations and then read operations in the same sequence as the request signals are generated. Finally, in FIGS. 16H and 15D, the illustrated sequence of requests includes a refresh request, a read request and a write request (i.e., a refresh-then-read-then-write sequence). This sequence results in the performance of refresh operations, then read operations and then write operations in the same sequence as the request signals are generated.

Figures 14, 14A:
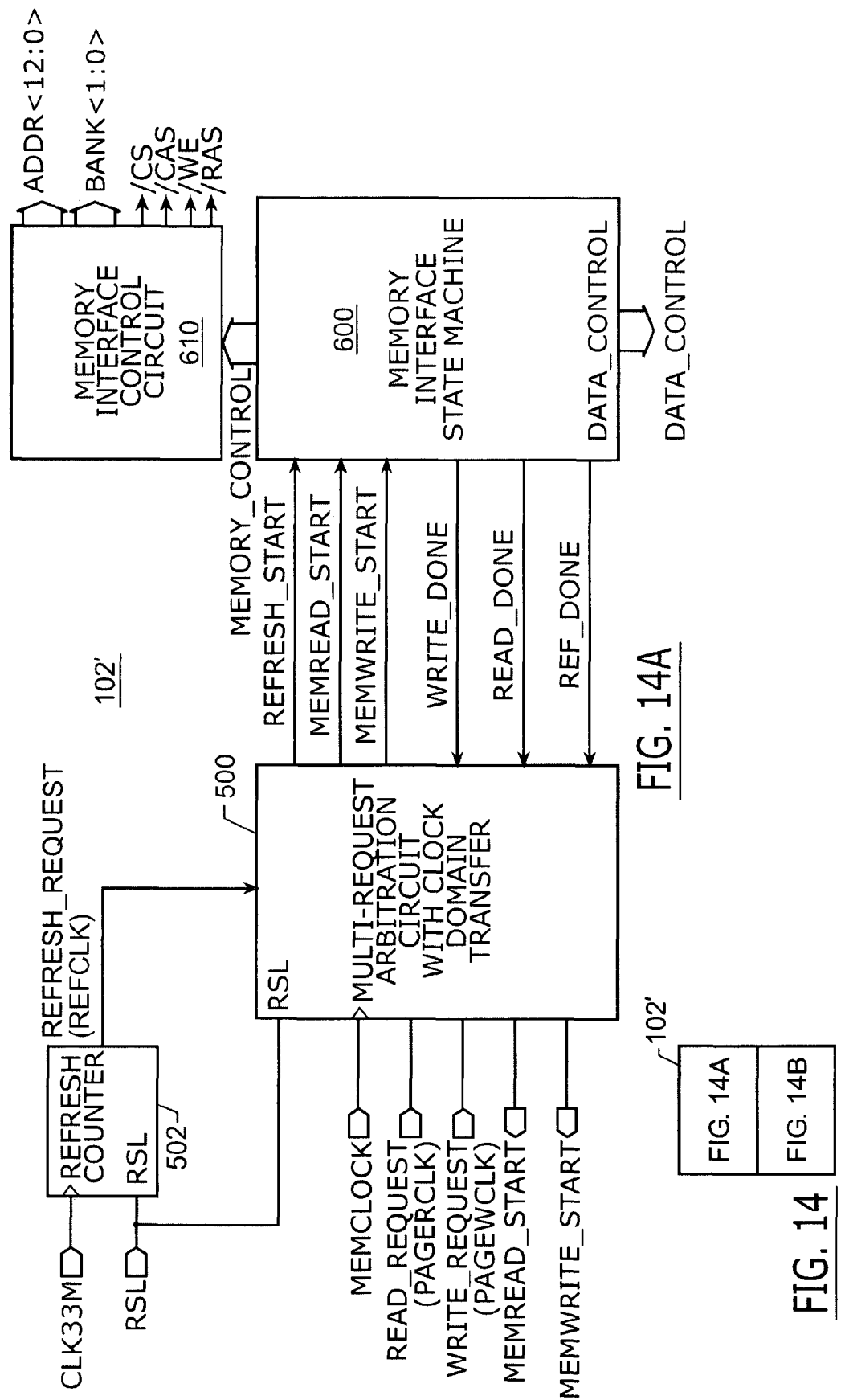
FIG. 14 is a block diagram that illustrates a read/write data path associated with the FIFO controller of FIG. 11.

Aspects of the FIFO controller 102 of FIG. 11 will now be described more fully with respect to FIG. 14. In particular, FIG. 14 illustrates a FIFO controller 102' having various arbitration control circuits and memory interface and control circuits therein. As illustrated by FIG. 14A, a multi-request arbitration circuit 500 is provided that generates a plurality of start signals: REFRESH_START, MEMREAD_START and MEMWRITE_START, which are illustrated by the timing diagrams of FIGS. 16A–16H. These start signals (commands) are received by a memory interface state machine 600 and the quad-port cache control circuit 14'. The refresh start signal (REFRESH_START) is generated in response to a refresh request signal (REFCLK) that is received by the arbitration circuit 500. The refresh request signal is generated by a refresh counter 502. This refresh counter is responsive to a clock signal (shown as CLK33M) and an active low global reset signal RSL. A preferred embodiment of this arbitration circuit 500 is more fully illustrated by FIGS. 17A–17B. The clock signal CLK33M may be an input clock signal having a frequency of 33.33 MHz. This clock signal may be used with a phase locked loop (PLL), now shown, to generate another clock signal (e.g., MEMCLK) having a frequency of 133.33 MHz or 166.67 MHz, for example.

The arbitration circuit 500 is responsive to a read request signal (READ_REQUEST) and a write request signal (WRITE_REQUEST), which are generated by a FIFO control circuit 15. These request signals are also illustrated as respective clocks signals PAGERCLK and PAGEWCLK in FIGS. 16A–16H. The arbitration circuit 500 is synchronized with a clock signal, shown as MEMCLOCK. This clock signal MEMCLOCK may have a frequency of about 166.67 MHz in some applications. The arbitration circuit 500 is also responsive to various signals that reflect completion of read, write and refresh operations. These "completion" signals are illustrated as WRITE_DONE, READ_DONE and REF_DONE.

The memory interface state machine 600 is configured to generate memory control signals (MEMORY_CONTROL) and data control signals (DATA_CONTROL) in response to the start signals. Moreover, the memory interface state machine 600 is configured to generate the WRITE_DONE, READ_DONE and REFRESH_DONE signals as active low pulses upon completion of the respective write, read and refresh operations. A memory interface control circuit 610 is also provided. This interface control circuit 610, which is responsive to the memory control signals, generates signals that are compatible with DRAM memory devices. These signals are illustrated as ADDR<12:0>, which represents a 13-bit row address, BANK<1:0>, which represents a bank select signal, and a plurality of single bit signals. These single bit signals are shown as a chip select signal (/CS), a column address strobe signal (/CAS), a write enable signal (/WE) and a row address strobe signal (/RAS). Different signals will be used in the event the DDR memory device 140 is an SRAM device.

Figure 14B:
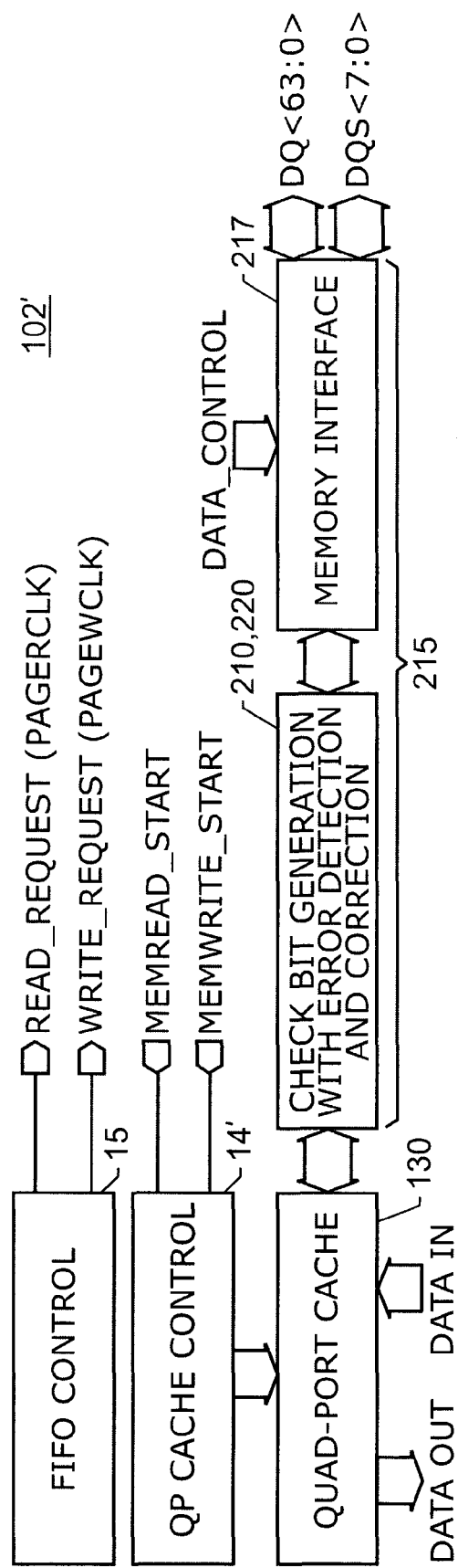

Referring now to FIG. 14B, the quad-port cache 130 and data transfer control circuit 215 are illustrated. The data transfer control circuit 215 includes the check bit generation circuits 210 and error detection and correction circuits 220 illustrated in FIG. 11 and a memory interface circuit 217 that is responsive to the data control signals (DATA_CONTROL). The memory interface circuit 217 is coupled to the DDR memory device 140 by a data bus (shown as DQ<63:0>) and data strobe bus (shown as DQS<7:0>).

Figure 17A:
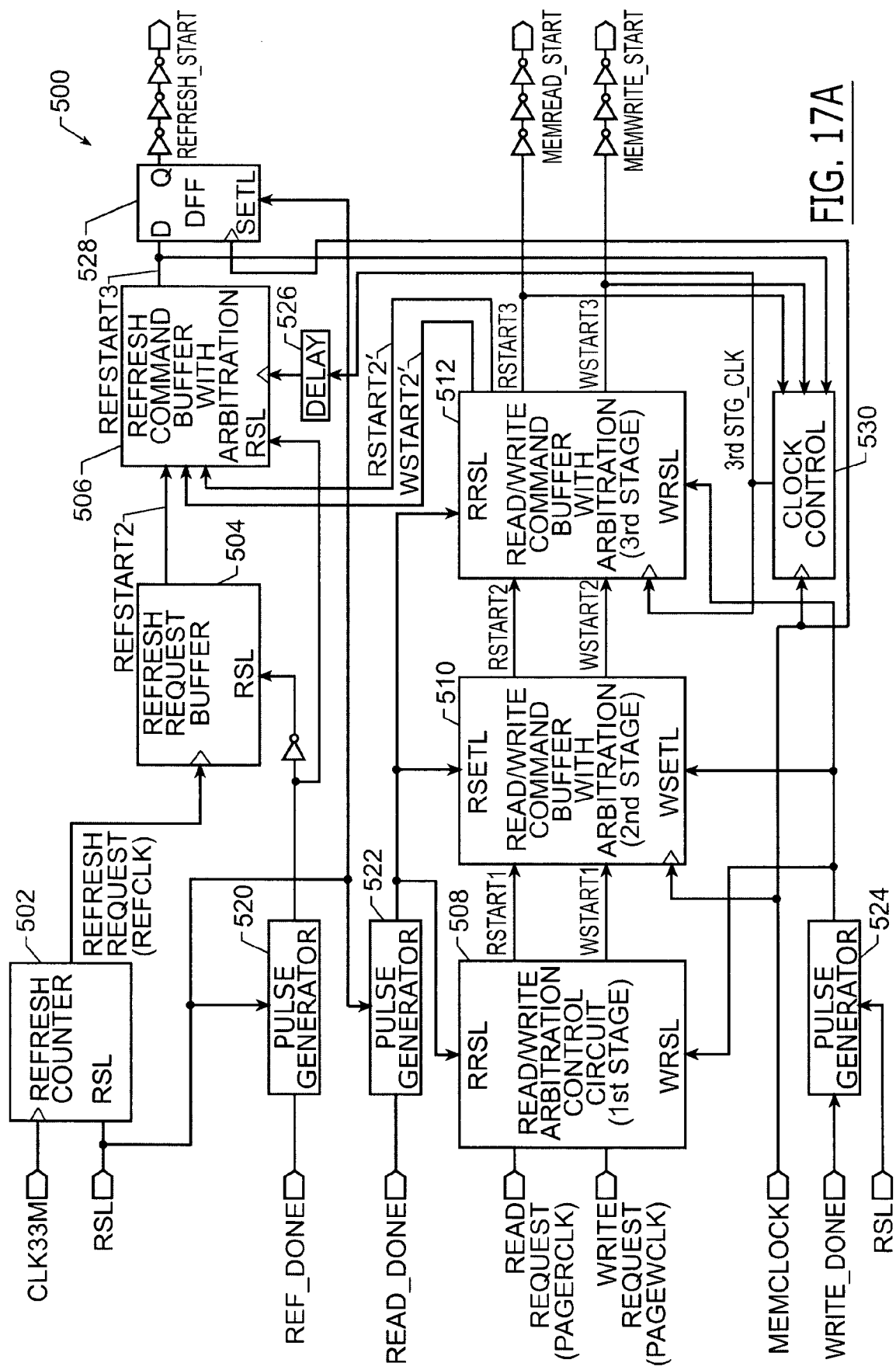
FIG. 17A is a block diagram of a request signal arbitration circuit according to embodiments of the present invention.
Figure 17B:
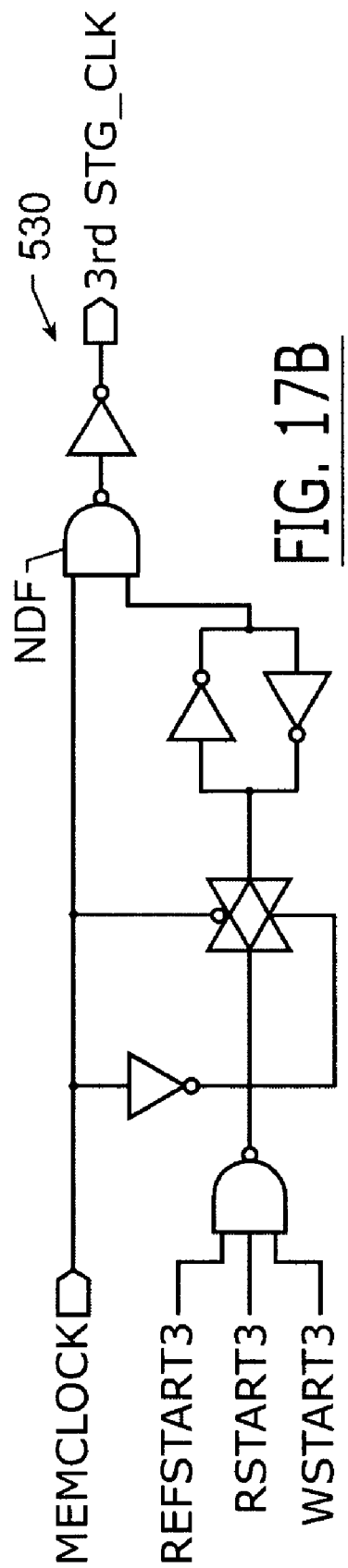
FIG. 17B is an electrical schematic of the clock control circuit of FIG. 17A.

FIGS. 17A and 17B illustrate a multi-stage arbitration control circuit 500 that may be used as the arbitration circuit 500 illustrated by FIG. 14. FIG. 17A also illustrates a refresh counter 502 that periodically generates a refresh request REFRESH REQUEST (shown as REFCLK in FIGS. 16A–16H). The multiple stages within the arbitration control circuit 500 include a read/write arbitration control circuit 508 (1st stage), a first read/write command buffer and arbitration circuit 510 (2nd stage) and a second read/write command buffer and arbitration circuit 512 (3rd stage). The read/write arbitration control circuit 508 is responsive to read and write request signals (READ REQUEST and WRITE REQUEST), which are also illustrated as PAGERCLK and PAGEWCLK in the timing diagrams of FIGS. 16A–16H. These request signals are asynchronously timed relative to each other by virtue of the fact that FIFO read operations and FIFO write operations are independently controlled by separate external clocks. In response to these request signals, the read/write arbitration control circuit 508 generates first arbitration results, which are shown as a first read start command (RSTART1) and a first write start command (WSTART1). These first arbitration results identify which of two request signals was first in time. The read/write arbitration control circuit 508 has two reset terminals, shown as RRSL (read reset low) and WRSL (write reset low). These terminals received reset pulses that are generated by a read reset pulse generator 520 and write reset pulse generator 524. The read reset pulse generator 520 is responsive to the global reset signal RSL and the READ_DONE signal, which is generated by the memory interface state machine 600 of FIG. 14A to signify completion of read operations. The write reset pulse generator 524 is responsive to the global reset signal RSL and the WRITE_DONE signal, which signifies completion of write operations.

The first read/write command buffer and arbitration circuit 510 (2nd stage) is configured to buffer and rearbitrate the first arbitration results (RSTART1 and WSTART1) and generate second arbitration results (RSTART2 and WSTART2) that confirm or, if necessary, correct the first arbitration results if timing jitter caused an erroneous initial result. The first read/write command buffer and arbitration circuit 510 is synchronized with a clock signal, shown as MEMCLOCK. Thus, the second arbitration results (RSTART2 and WSTART2) represent a transfer of the first arbitration results (RSTART1 and WSTART1) into a new clock domain (controlled by MEMCLOCK) that is asynchronously timed relative to the clock domains associated with the generation of the read and write request signals (PAGERCLK and PAGEWCLK). The first read/write command buffer and arbitration circuit 510 has two set terminals, shown as RSETL (read set low) and WSETL (write set low).

The second read/write command buffer and arbitration circuit 512 (3rd stage) is configured to buffer and rearbitrate the second arbitration results (RSTART2 and WSTART2) and generate third arbitration results (RSTART3 and WSTART3) that confirm or, if necessary, correct the second arbitration results. The second read/write command buffer and arbitration circuit 512 is synchronized with a third stage clock signal (3rd STG_CLK), which is generated by a clock control circuit 530. This clock control circuit is synchronized to the clock signal MEMCLOCK. The second read/write command buffer and arbitration circuit 512 has two reset terminals, shown as RRSL (read reset low) and WRSL (write reset low). As illustrated, the read start signal MEMREAD_START and the write start signal MEMWRITE_START are derived from the third arbitration results RSTART3 and WSTART3.

The refresh request signal REFRESH REQUEST is provided as a clock signal to a refresh request buffer 504, which has an active low reset terminal RSL. This refresh request buffer 504 generates an active high intermediate refresh start command REFSTART2 in response to a low-to-high transition of the refresh request signal. The refresh start command REFSTART2 is provided to a refresh command buffer and arbitration circuit 506, which has an active low reset terminal RSL. The refresh request buffer 504 and the refresh command buffer and arbitration circuit 506 are reset on opposite edges of a reset signal that is generated by a reset pulse generator 520. This reset pulse generator 520 is responsive to the REF_DONE signal, which is generated by the memory interface state machine 600 to signify completion of the refresh operations.

The refresh command buffer and arbitration circuit 506 arbitrates between three start commands and generates a third arbitration result (for refresh), shown as REFSTART3, in response to a plurality of intermediate start signals. These intermediate start signals are shown as REFSTART2, which is generated by the refresh request buffer 504, and RSTART2' and WSTART2', which are generated by the second read/write command buffer and arbitration circuit 512. The third arbitration result REFSTART3 is latched by a D-type flip-flop 528, which is synchronized with the clock signal MEMCLOCK. The D-type flip-flop 528 has an active low set terminal SETL, which receives the global reset signal RSL. As illustrated by FIG. 17B, the third arbitration results for refresh, read and write (i.e., REFSTART3, RSTART3 and WSTART3) control the timing of the third stage clock signal (3rd STG_CLK). In particular, only when all three final start commands: REFRESH_START, MEMREAD_START and MEMWRITE_START at set to inactive low levels (and REFSTART3=RSTART3=WSTART3=1), will the NAND gate NDF in FIG. 17B be enabled to pass the clock signal MEMCLOCK as the third stage clock signal 3rd STG_CLK. This third stage clock signal 3rd STG_CLK is provided to the refresh command buffer and arbitration circuit 506 after a short delay, which is provided by a delay circuit 526. Accordingly, only when all of the three start signals (REFSTART3, RSTART3 and WSTART3) are inactive at high levels will the second read/write command buffer and arbitration circuit 512 and the refresh command buffer and arbitration circuit 506 be enabled to generate a final refresh, read or write start command (REFRESH_START, MEMREAD_START, MEMWRITE_START), as illustrated by FIGS. 16A–16H.

Therefore, as described above, the multi-stage arbitration control circuit 500 can be used to arbitrate between first and second request signals (e.g., PAGERCLK and PAGEWCLK) generated in respective first and second clock domains that are asynchronously timed relative to each other. These arbitration operations are performed to obtain first arbitration results (e.g., RSTART1 and WSTART1) that identify a relative queue priority between the first and second request signals. These first arbitration results are also transferred into a third clock domain (e.g., MEMCLOCK) that is asynchronously timed relative to the first and second clock domains. This transfer operation may include arbitrating the first arbitration results in the third clock domain to obtain second arbitration results (e.g., RSTART2 and WSTART2) that confirm or correct the first arbitration results. To provide additional buffering to insure accuracy, the second arbitration results are rearbitrated in the third clock domain to obtain third arbitration results (e.g., RSTART3 and WSTART3) that confirm or correct the second arbitration results. The refresh command buffer and arbitration circuit 506 further arbitrates between a refresh start command and read and write start signals generated by said multi-stage arbitration control circuit, in order to generate another arbitration result (REFSTART3) that controls the timing of a refresh start command REFRESH_START.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A signal arbitration method, comprising the steps of:
arbitrating between first and second request signals generated in respective first and second clock domains that are asynchronously timed relative to each other, to obtain first arbitration results that identify a relative queue priority between the first and second request signals; and
transferring the first arbitration results into a third clock domain that is asynchronously timed relative to the first and second clock domains.

2. A signal arbitration method, comprising the steps of:
arbitrating between first and second request signals generated in respective first and second clock domains that are asynchronously timed relative to each other, to obtain first arbitration results that identify a relative queue priority between the first and second request signals; and
transferring the first arbitration results into a third clock domain that is asynchronously timed relative to the first and second clock domains, said transferring step comprising arbitrating the first arbitration results in a third clock domain to obtain second arbitration results that confirm or correct the first arbitration results.

3. The method of claim 2, wherein said step of arbitrating the first arbitration results is followed by the step of arbitrating the second arbitration results in the third clock domain to obtain third arbitration results that confirm or correct the second arbitration results.

4. The method of claim 1, wherein the first and second request signals are read and write request signals, respectively.

5. A signal arbitration method, comprising the steps of:
arbitrating between first and second request signals generated in respective first and second clock domains that are asynchronously timed relative to each other, to obtain intermediate arbitration results that identify a relative queue priority between the first and second request signals; and
arbitrating between a third request signal and the intermediate arbitration results in a third clock domain that is asynchronously timed relative to the first and second clock domains, to obtain final arbitration results that identify a relative queue priority between the first, second and third request signals.

6. The method of claim 5, wherein the third request signal has a higher request priority relative to the first and second request signals.

7. A signal arbitration method, comprising the steps of:
arbitrating between first and second request signals generated in respective first and second clock domains that are asynchronously timed relative to each other, to obtain intermediate arbitration results that identify a relative queue priority between the first and second request signals; and
arbitrating between a third request signal and the intermediate arbitration results in a third clock domain that is asynchronously timed relative to the first and second clock domains, to obtain final arbitration results that identify a relative queue priority between the first, second and third request signals;
wherein the third request signal has a higher request priority relative to the first and second request signals; and
wherein the first, second and third request signals are received in a first-then-second-then-third timing sequence; and wherein said step of arbitrating between the first and second request signals is followed by the step of performing operations associated with the first, second and third requests one-at-a-time in a first-then-third-then-second operation sequence.

8. A signal arbitration method, comprising the steps of:
arbitrating between first and second request signals generated in respective first and second clock domains that are asynchronously timed relative to each other, to obtain intermediate arbitration results that identify a relative queue priority between the first and second request signals; and
arbitrating between a third request signal and the intermediate arbitration results in a third clock domain that is asynchronously timed relative to the first and second clock domains, to obtain final arbitration results that identify a relative queue priority between the first, second and third request signals;

wherein the third request signal has a higher request priority relative to the first and second request signals; and wherein the first, second and third request signals are received in a second-then-first-then-third timing sequence; and wherein said step of arbitrating between the first and second request signals is followed by the step of performing operations associated with the first, second and third requests one-at-a-time in a second-then-third-then-first operation sequence.

9. A signal arbitration method, comprising the steps of:

arbitrating between first and second request signals generated in respective first and second clock domains that are asynchronously timed relative to each other, to obtain first arbitration results that identify the first request signal as having a higher queue priority relative to the second request signal;

transferring the first arbitration results into a third clock domain that is asynchronously timed relative to the first and second clock domains;

issuing a first start command corresponding to the first request signal in the third clock domain, while maintaining the second request signal as a queued second request; and arbitrating between a third request signal and the queued second request to obtain second arbitration results that identify a relative queue priority between the second queued request and the third request signal.

10. The method of claim 9, wherein the second arbitration results identify the third request signal as having a higher queue priority relative to the second queued request when said step of arbitrating between a third request signal and the queued second request occurs prior to completion of operations responsive to the first start command.

11. A signal arbitration device, comprising:

a multi-stage arbitration control circuit that is configured to arbitrate between at least first and second request signals generated in respective first and second clock domains that are asynchronously timed relative to each other and transfer arbitration results that identify a relative queue priority between the first and second request signals into a third clock domain that is asynchronously timed relative to the first and second clock domains.

12. A signal arbitration device, comprising:

a multi-stage arbitration control circuit that is configured to arbitrate between at least first and second request signals generated in respective first and second clock domains that are asynchronously timed relative to each other and transfer arbitration results that identify a relative queue priority between the first and second request signals into a third clock domain that is asynchronously timed relative to the first and second clock domains, said multi-stage arbitration control circuit comprising:

a first arbitration stage that is configured to arbitrate a request priority between the at least first and second request signals and generate first arbitration results that identify a relative queue priority between the at least first and second request signals; and a second arbitration stage that is configured to buffer and rearbitrate a request priority associated with the first arbitration results.

13. The device of claim 12, wherein said second arbitration stage is responsive to a clock signal that operates in the third clock domain.

14. The device of claim 12, wherein said multi-stage arbitration control circuit is configured to double buffer the first arbitration results.

15. The device of claim 14, wherein said second arbitration stage is configured to generate second arbitration results that confirm or correct the first arbitration results.

16. The device of claim 15, wherein said multi-stage arbitration control circuit further comprises:

a third arbitration stage that is configured to buffer and rearbitrate a request priority associated with the second arbitration results.

17. The device of claim 16, wherein said third arbitration stage is electrically coupled to a clock control circuit that is responsive to the third arbitration results.

18. The device of claim 17, wherein the clock control circuit is responsive to the clock signal that operates in the third clock domain.

19. A signal arbitration device, comprising:

a multi-stage arbitration control circuit that is configured to arbitrate between read and write request signals generated in respective first and second clock domains that are asynchronously timed relative to each other and is further configured to transfer arbitration results that identify a relative queue priority between the read and write request signals into a third clock domain that is asynchronously timed relative to the first and second clock domains; and a refresh command buffer and arbitration circuit that is responsive to a refresh start command and read and write start signals generated by said multi-stage arbitration control circuit.

20. The device of claim 19, further comprising a clock control circuit that is responsive to read, write and refresh start signals generated by said multi-stage arbitration control circuit and said refresh command buffer and arbitration circuit.

21. The device of claim 20, wherein said multi-stage arbitration control circuit is responsive to a clock signal generated by said clock control circuit.

22. The device of claim 21, wherein said multi-stage arbitration control circuit comprises a third stage that is synchronized with the clock signal generated by said clock control circuit.

* * * * *